(12) United States Patent
Hiranuma et al.

(10) Patent No.: US 9,905,517 B2
(45) Date of Patent: Feb. 27, 2018

(54) SEMICONDUCTOR DEVICE

(71) Applicant: Renesas Electronics Corporation, Tokyo (JP)

(72) Inventors: Kazuhiko Hiranuma, Tokyo (JP); Kazuyuki Sakata, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 266 days.

(21) Appl. No.: 15/002,482

(22) Filed: Jan. 21, 2016

(65) Prior Publication Data

US 2016/0240487 A1 Aug. 18, 2016

(30) Foreign Application Priority Data

Feb. 17, 2015 (JP) ................. 2015-028403

(51) Int. Cl.
*H01L 23/66* (2006.01)
*H01L 23/31* (2006.01)
(Continued)

(52) U.S. Cl.
CPC .............. *H01L 23/66* (2013.01); *H01L 24/49* (2013.01); *H01L 21/561* (2013.01);
(Continued)

(58) Field of Classification Search
CPC ......... H01L 23/66; H01L 24/49; H01L 24/13; H01L 24/16; H01L 24/29; H01L 24/32; H01L 24/45; H01L 24/48; H01L 24/73; H01L 24/85; H01L 2224/0401; H01L 2224/04042; H01L 2224/05624; H01L 2224/06135; H01L 2224/131; H01L 2224/13144; H01L 2224/13147; H01L 2224/16225; H01L 2224/16227; H01L 2224/2919; H01L 2224/32225; H01L 2224/45144; H01L 2224/45147; H01L 2224/48091; H01L 2224/48227; H01L 2224/49171; H01L 2224/73204;
(Continued)

(56) References Cited

U.S. PATENT DOCUMENTS 6,812,565 B2 * 11/2004 Nishimoto .............. H01L 23/50
257/723
8,383,456 B2 * 2/2013 Okada ..................... H01L 23/50
257/777
2006/0192282 A1 8/2006 Suwa et al.

FOREIGN PATENT DOCUMENTS

JP 2006-237385 A 9/2006
JP 2008-153288 A 7/2008

* cited by examiner

Primary Examiner — Mark Tornow
(74) Attorney, Agent, or Firm — Mattingly & Malur, PC

(57) ABSTRACT

Signal transmission characteristics of a semiconductor device are improved. A plurality of wirings of a wiring substrate on which a semiconductor chip is mounted include a first wiring and a second wiring that constitute a differential pair for use in transmitting a differential signal. Moreover, the first wiring and the second wiring respectively have first portions that extend in parallel with each other with a first clearance and second portions that are formed on the same wiring layer as the first portions, and extend in parallel with each other with a second clearance and third portions that are installed between the first portions and the second portions and designed to detour in such directions as to allow the mutual clearance to become greater than the first clearance and the second clearance.

17 Claims, 21 Drawing Sheets

(51) Int. Cl.
 *H01L 21/56* (2006.01)
 *H01L 23/00* (2006.01)
(52) U.S. Cl.
 CPC .......... *H01L 23/3128* (2013.01); *H01L 24/13* (2013.01); *H01L 24/16* (2013.01); *H01L 24/29* (2013.01); *H01L 24/32* (2013.01); *H01L 24/45* (2013.01); *H01L 24/48* (2013.01); *H01L 24/73* (2013.01); *H01L 24/85* (2013.01); *H01L 2223/6611* (2013.01); *H01L 2223/6638* (2013.01); *H01L 2224/0401* (2013.01); *H01L 2224/04042* (2013.01); *H01L 2224/05624* (2013.01); *H01L 2224/06135* (2013.01); *H01L 2224/131* (2013.01); *H01L 2224/13144* (2013.01); *H01L 2224/13147* (2013.01); *H01L 2224/16225* (2013.01); *H01L 2224/16227* (2013.01); *H01L 2224/2919* (2013.01); *H01L 2224/32225* (2013.01); *H01L 2224/45144* (2013.01); *H01L 2224/45147* (2013.01); *H01L 2224/48091* (2013.01); *H01L 2224/48227* (2013.01); *H01L 2224/49171* (2013.01); *H01L 2224/73204* (2013.01); *H01L 2224/73265* (2013.01); *H01L 2224/85203* (2013.01); *H01L 2224/85205* (2013.01); *H01L 2224/92247* (2013.01); *H01L 2224/97* (2013.01); *H01L 2924/00011* (2013.01); *H01L 2924/10253* (2013.01); *H01L 2924/10271* (2013.01); *H01L 2924/15311* (2013.01); *H01L 2924/15313* (2013.01); *H01L 2924/181* (2013.01); *H01L 2924/3011* (2013.01)

(58) Field of Classification Search
 CPC . H01L 2224/43265; H01L 2224/85203; H01L 2224/85205; H01L 2224/92247; H01L 2224/97; H01L 2224/00011; H01L 2224/10253; H01L 2224/10271; H01L 2224/15311; H01L 2224/15313; H01L 2224/181; H01L 2224/3011
 See application file for complete search history.

SEMICONDUCTOR DEVICE

CROSS-REFERENCE TO RELATED APPLICATION

The present application claims priority from Japanese Patent Applications No. 2015-28403 filed on Feb. 17, 2015, the content of which is hereby incorporated by reference into this application.

TECHNICAL FIELD OF THE INVENTION

The present invention relates to a semiconductor device. The present invention also relates to technique that is effectively applied to, for example, a semiconductor device formed by mounting a semiconductor chip on a wiring substrate.

BACKGROUND OF THE INVENTION

Japanese Patent Application Laid-Open Publication No. 2006-237385 (Patent Document 1) discloses a semiconductor device in which wirings for use in transmitting a differential signal are formed on a wiring substrate on which a semiconductor chip is mounted.

Moreover, Japanese Patent Application Laid-Open Publication No. 2008-153288 (Patent Document 2) discloses a semiconductor device in which a pair of wirings for transmitting a differential signal is formed so as to meander while extending in parallel with each other.

SUMMARY OF THE INVENTION

As technique for transmitting a signal at a high speed, for example, technique for transmitting a differential signal by using two signal lines forming a differential pair, such as a communication system, for example, PCI-Express, USB or the like, has been known.

However, in the case when, for example, a high-speed differential signal is transmitted from the outside of a semiconductor device to a semiconductor chip mounted on a wiring substrate, problems with signal transmission characteristics have become more conspicuous in comparison with a case where a low-speed differential signal is transmitted; therefore, a countermeasure is required in which respective impedances of the two wirings forming the differential pair are taken into consideration (adjusted).

These and other problems and novel features will become apparent upon consideration of the description of the present specification taken in conjunction with the accompanying drawing.

A semiconductor device according to one embodiment includes: a wiring substrate, a semiconductor chip mounted on the wiring substrate and a plurality of conductive members that respectively connect the semiconductor chip and the wiring substrate with each other. Moreover, the wiring substrate has a plurality of wirings that electrically connect the plurality of conductive members with a plurality of external terminals. Furthermore, the plurality of wirings include a first wiring and a second wiring that constitute a differential pair that transmits a differential signal. Moreover, each of the first wiring and the second wiring has a first portion, a second portion formed on the same wiring layer as the first portion, and a third portion formed between the first portion and the second portion, the first portion of the first wiring and the first portion of the second wiring being extended in plan view in parallel with each other with a first clearance, the second portion of the first wiring and the second portion of the second wiring being extended in plan view in parallel with each other with a second clearance, and the third portion of the first wiring and the third portion of the second wiring being extended in plan view such that the third portion of the first wiring and the third portion of the second wiring are detoured in a direction to be made a clearance greater than the first clearance and the second clearance.

According to the above-mentioned embodiment, it becomes possible to improve the signal transmission characteristics of the semiconductor device.

BRIEF DESCRIPTIONS OF THE DRAWINGS

DESCRIPTIONS OF THE PREFERRED EMBODIMENTS

Figure 1:
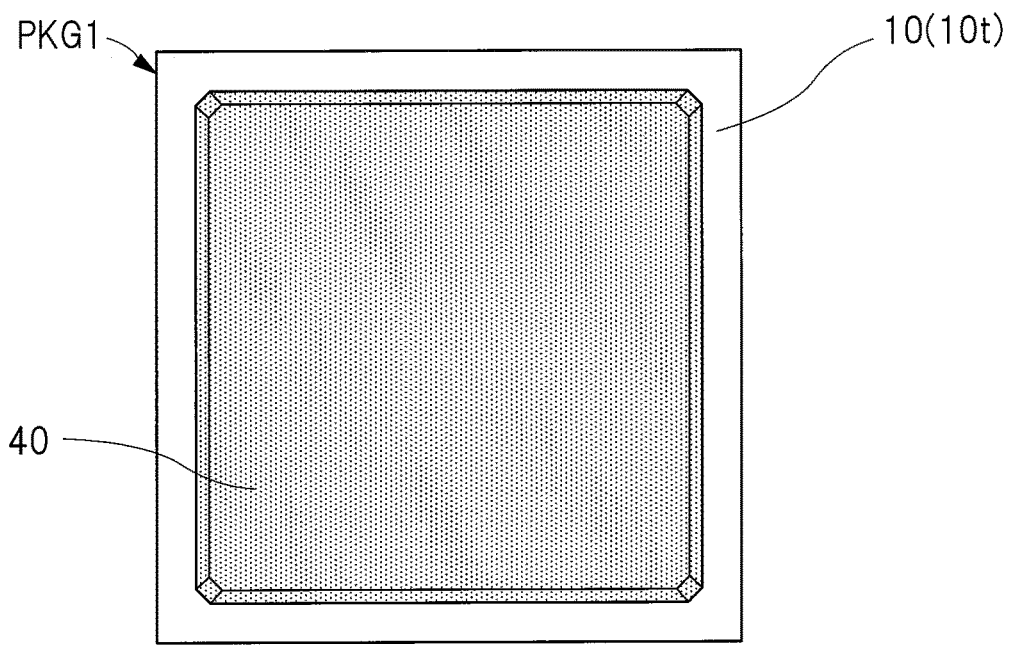
FIG. 1 is a top view showing a semiconductor device according to one embodiment.

Description of Description Form/Basic Term/Usage in Present Application

In the present embodiments, the embodiments will be described in a plurality of sections or others for convenience. However, these sections are not irrelevant to each other unless otherwise stated, and the one of each part of a single example is a detailed part or a part of the other or the entire modification example or others. Also, in principle, the repetitive description of the same part is omitted. Further, the respective components according to the embodiments are not always indispensable unless otherwise stated or except the case where the number is logically limited to the number or the components are apparently indispensable in principle from the context.

Similarly, even when "formed of A" or others is described for materials, components or the like in the description of the embodiments or others, other components than A are not eliminated unless otherwise specified to be only the component or except the case where the components are apparently indispensable in principle from the context. For example, when the component is described, the description means "X containing A as a main component". For example, even in the description of "silicon material" or others, it is needless to say that the silicon material is not limited to pure silicon but includes SiGe (silicon germanium) alloy, other multiple-component alloy containing other silicon as a main component, and a component containing other additives or others. Also, even in the description of a gold plating, a Cu layer, a nickel/plating, and others, they are not only the pure ones but also components containing gold, Cu, nickel, and others as the main component, respectively.

Further, when referring to the specific numerals and amounts, they may be the numerals larger or smaller than the specific numerals.

Also, the same or similar components are denoted by the similar reference symbols or reference numbers throughout the respective drawings of the embodiments, and the description thereof is not repeated in principle.

Also, in the attached drawings, hatching or others is omitted in some cases even in a cross-sectional view in a conversely complicated case or a case in which a space is clearly distinguished therefrom. In respect to this, in a case in which it is clear from the description or others, an outline of the background is omitted in some cases even in a hole which is closed in a planar view. Further, hatching or a dot pattern is added to the drawings even if the drawing is not illustrated in the cross-sectional view in order to explicitly illustrate so as not to be the space or explicitly illustrate a boundary between regions.

<Outline of Semiconductor Device>

Figure 2:
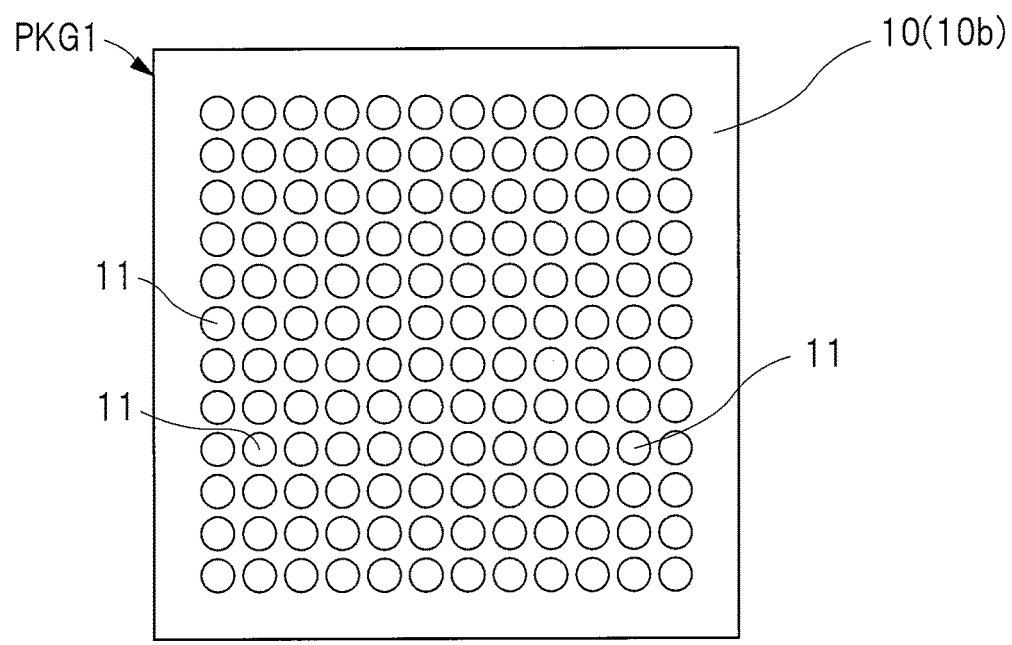
FIG. 2 is a bottom view showing the semiconductor device of FIG. 1.
Figure 3:
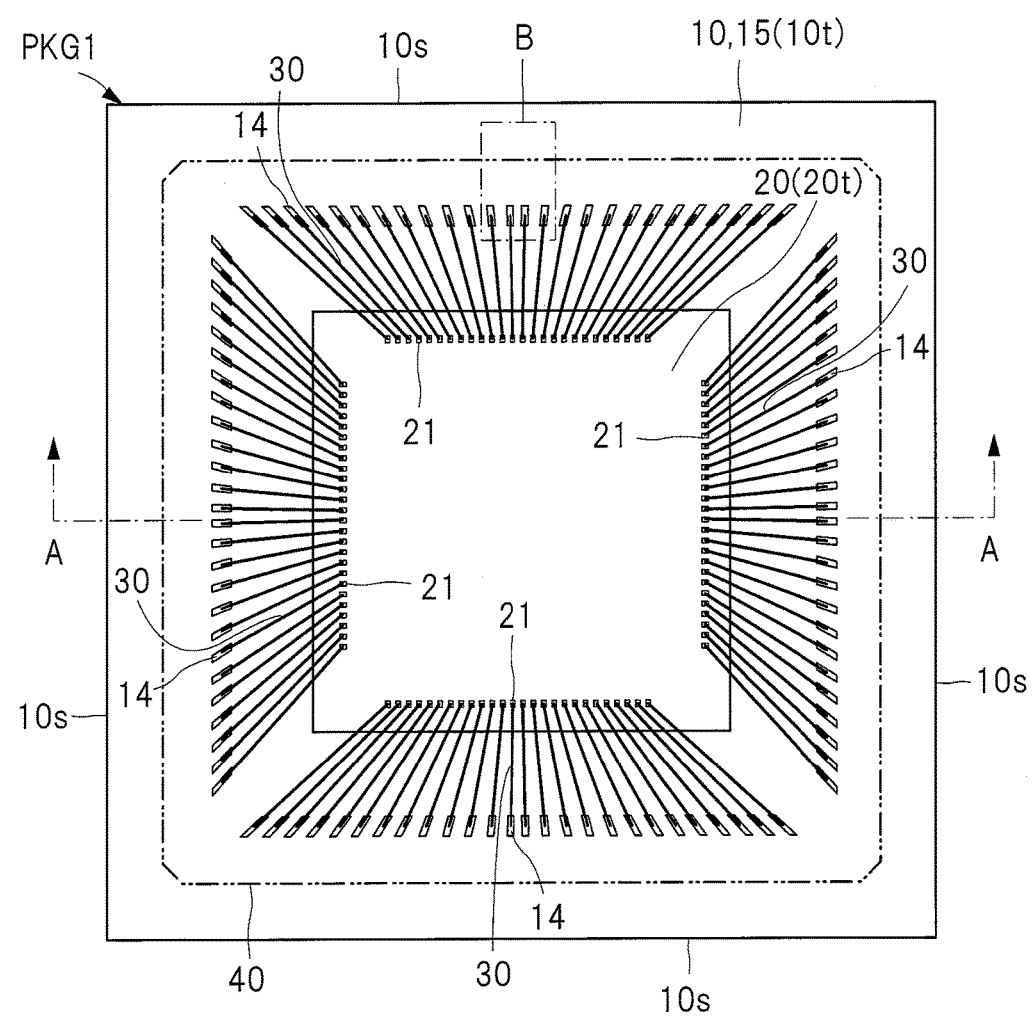
FIG. 3 is a perspective plan view showing an internal structure when seen through a sealing member shown in FIG. 1.
Figure 4:
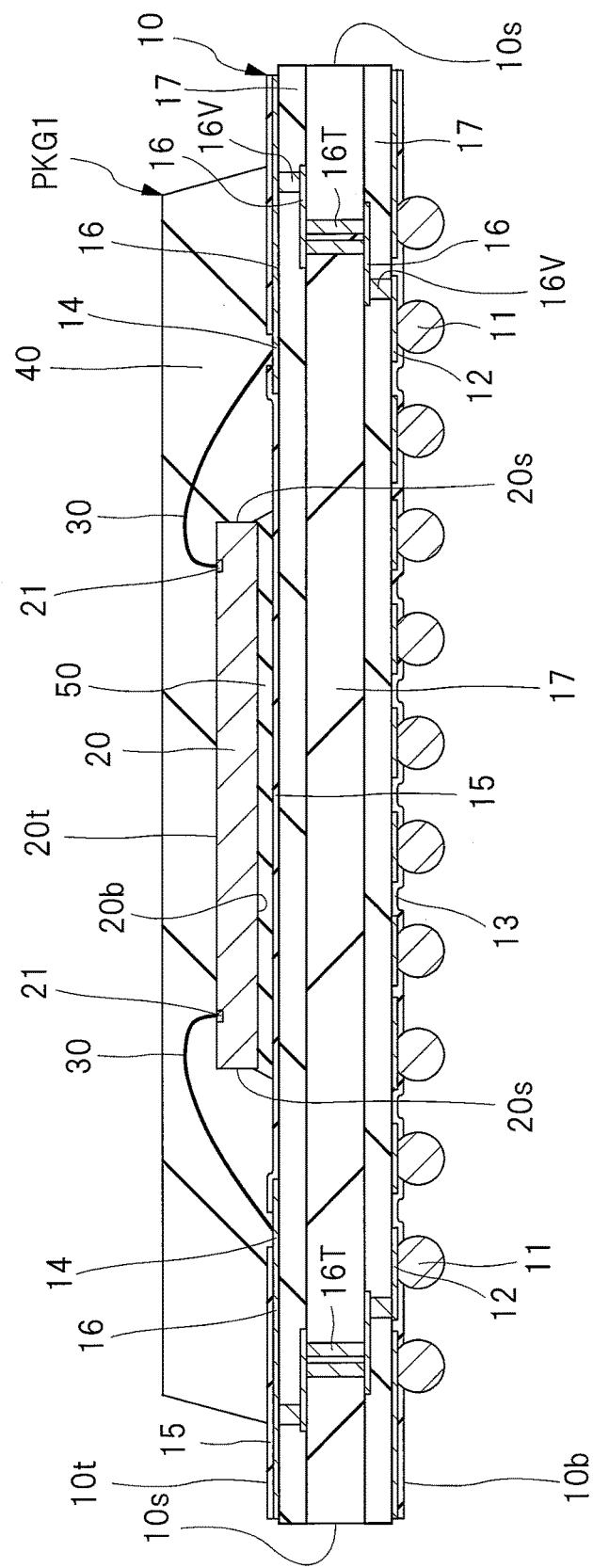
FIG. 4 is a cross-sectional view taken along the line A-A of FIG. 3.

First, referring to FIG. 1 to FIG. 4, the following description will explain a schematic configuration of a semiconductor device according to the present embodiment. FIG. 1 is a top view of the semiconductor device of the present embodiment, and FIG. 2 is a bottom view of the semiconductor device shown in FIG. 1. Moreover, FIG. 3 is a perspective plan view showing an internal structure when seen through a sealing member shown in FIG. 1. FIG. 4 is a cross-sectional view taken along the line A-A of FIG. 3. Additionally, in FIG. 3, the contour of a sealing member 40 is indicated by a two-dot chain line.

A semiconductor device PKG1 of the present embodiment is provided with a wiring substrate (package substrate) 10, a semiconductor chip 20 (see FIGS. 3 and 4) mounted on the wiring substrate 10, a plurality of wirings 30 (see FIGS. 3 and 4) electrically connecting the semiconductor chip 20 with the wiring substrate 10 and the sealing member 40 for sealing the plurality of wirings 30.

The wiring substrate 10 provided in the semiconductor device PKG1 is a substrate in which a transmission path for supplying electric signals and electric potentials between the semiconductor device PKG1 and a packaged substrate not shown. As shown in FIG. 4, the wiring substrate 10 is provided with an upper surface (surface, chip mounting surface) 10t serving as a chip mounting surface on which the semiconductor chip 20 is mounted and a lower surface (rear surface, packaging surface) 10b located on the side opposite to the upper surface 10t. Moreover, in the example of the present embodiment, the wiring substrate 10 has a square shape when seen in a plan view, with four side faces 10s (see FIG. 3 and FIG. 4).

Moreover, as shown in FIG. 2, the semiconductor device PKG1 has a plurality of solder balls (e.g., external terminals, electrodes, external electrodes) 11 formed on the lower surface 10b of the wiring substrate 10. The plurality of solder balls 11 are disposed in a matrix form (array state, matrix state). Each of the plurality of solder balls 11 is connected to each of the lands (e.g., external terminals, electrodes, external electrodes) 12 (see FIG. 4).

More specifically, as shown in FIG. 4, the lower surface 10b of the wiring substrate 10 is covered with an insulating film (solder resist film) 13. Moreover, on the insulating film 13, a plurality of openings are formed, and at least one portion of the lands 12 is exposed from the insulating film 13 in each of the plurality of openings. The solder balls 11 are connected to portions of the land 12 that are exposed from the insulating film 13.

As in the case of the semiconductor device PKG1, the semiconductor device in which the plurality of external terminals (solder balls 11, lands 12) are disposed in a matrix form on the packaging surface side is referred to as an area array-type semiconductor device. The area array-type semiconductor device PKG1 makes it possible to effectively utilize the packaging surface (lower surface 10b) side of the wiring substrate 10 as a disposing space for the external terminals; therefore, it is preferable in that even when the number of the external terminals increases, the increase in the packaging area of the semiconductor device PKG1 can be suppressed. In other words, the semiconductor device PKG1 in which the number of the external terminals increases together with a higher functionality and a higher integration can be packaged with a reduced space.

Moreover, as shown in FIG. 3, the wiring substrate 10 is provided with a plurality of bonding pads (e.g., terminals, internal terminals, electrodes, bonding leads, and bonding fingers) 14 formed on the upper surface 10t. The plurality of bonding pads 14 are terminals for electrically connecting the wiring substrate 10 with the semiconductor chip 20. In the example shown in FIG. 3, the plurality of bonding pads 14 are installed on the periphery of the semiconductor chip 20, and electrically connected with the semiconductor chip 20 via the plurality of wirings 30.

In the example shown in FIG. 4, the upper surface 10t of the wiring substrate 10 is covered with an insulating film (solder resist film) 15. Moreover, on the insulating film 15, openings are formed, and on the openings, at least one portion of each of the bonding pads 14 is exposed from the insulating film 15. Furthermore, one of the terminals of the wire 30 is connected to the exposed portion of the bonding pads 14 from the insulating film 15.

Moreover, as shown in FIG. 4, the wiring substrate 10 is provided with a plurality of wiring layers (four in the example shown in FIG. 4) for electrically connecting the plurality of terminals (bonding pads 14) on the upper surface 10t side with the plurality of terminals (lands 12) on the lower surface 10b side. The plurality of wirings 16 formed on the respective wiring layers are covered with an insulating layer 17 for insulating portions between the plurality of wirings 16 as well as portions between the adjacent wiring layers. In the example shown in FIG. 4, the wiring substrate 10 is provided with the plurality of stacked insulating layers 17, with the insulating layer 17 located in the middle being prepared as a core layer (core material) formed, for example, by impregnating a fiber material such as glass fibers with a resin material such as an epoxy resin. Moreover, the insulating layer 17 to be formed on each of the upper surface and the lower surface of the core layer is formed, for example, by using a build-up engineering method. However, as a Modification Example relative to FIG. 4, a so-called coreless substrate having no insulating layer 17 forming the core layer may be used.

Among the plurality of wiring layers which the wiring substrate 10 has, the wiring 16 to be formed on the wiring layer of the upper-most side (wiring layer on the upper-most surface 10t side) is formed integrally with the bonding pad 14. In other words, the bonding pad 14 may be considered as one portion of the wiring 16. Moreover, in the case when the bonding pads 14 and the wirings 16 are considered as distinguished components, on the upper surface 10t of the wiring substrate 10, portions exposed from the insulating film 15 may be defined, as the bonding pad 14, and those portions covered with the insulating film 15 may be defined as the wirings 16. Furthermore, of the plurality of wiring layers which the wiring substrate 10 has, the wiring 16 to be formed on the wiring layer of the lower-most side (wiring layer on the lower-most surface 10b side) is formed integrally with the land 12. In other words, the land 12 may be considered as one portion of the wirings 16. Moreover, in the case when the lands 12 and the wirings 16 are considered as distinguished components, on the lower surface 10b of the wiring substrate 10, portions exposed from the insulating film 13 may be defined as the lands 12, and those portions covered with the insulating film 13 may be defined as the wirings 16.

Moreover, the wiring substrate 10 is provided with a via wiring 16V that is formed between the respective wiring layers, and serves as an interlayer conductive path connecting the stacked wiring layers with each other in the thickness direction. Furthermore, in the example shown in FIG. 4, the wiring substrate 10 is provided with the insulating layer 17 forming the core material. For this reason, the wiring substrate 10 is provided with a plurality of through-hole wirings 16T that penetrate the core material in the thickness direction, and the plurality of bonding pads 14 and the plurality of lands 12 are electrically connected with each other via the plurality of through-hole wirings 16T.

In this manner, the wiring substrate 10 constitutes one portion of a path for transmitting electric signals and electric potentials in between the plurality of solder balls 11 that are the external connection terminals of the semiconductor device PKG1 and the semiconductor chip 20. Additionally, as a Modification Example relative to FIG. 4, there is also a case in which the land 12 itself is allowed to function as the external connection terminal. In this case, no solder balls 11 are connected to the lands 12, and the plurality of lands 12 are respectively exposed from the insulating film 13 on the lower surface 10b of the wiring substrate 10. Moreover, as another Modification Example relative to FIG. 3, there is another case in which in place of the solder balls 11 having a ball shape, a thin solder film is connected and this solder film is allowed to function as the external connection terminal.

Moreover, as shown in FIG. 3 and FIG. 4, on the upper surface 10t of the wiring substrate 10, the semiconductor chip 20 is mounted. As shown in FIG. 4, the semiconductor chip 20 has a surface (main surface, upper surface) 20t, a rear surface (main surface, lower surface) 20b on the side opposite to the surface 20t, and side faces 20s located between the surface 20t and the rear surface 20b. Furthermore, the semiconductor chip 20 has a square external shape when seen on a plan view, as shown in FIG. 3.

As shown in FIG. 3 and FIG. 4, the semiconductor chip 20 has a plurality of pads (electrodes, chip electrodes) 21. The pads 21, which are external terminals of the semiconductor chip, are exposed from the insulating film coating the surface 20t of the semiconductor chip 20. Moreover, in the example shown in FIG. 3, the plurality of pads 21 are respectively installed on the peripheral edge side of the surface 20t along the respective sides of the surface 20t of the semiconductor chip 20.

Moreover, on the main surface (semiconductor element formation surface) of the semiconductor chip 20, a plurality of semiconductor elements (circuit elements), such as diodes, transistors or the like, are respectively formed, and respectively electrically connected with the plurality of pads 21 via wirings (wiring layers), not shown, formed on the semiconductor elements. In this manner, the semiconductor chip 20 forms an integrated circuit by the plurality of semiconductor elements formed on the main surface and wirings that electrically connect these plural semiconductor elements with one another.

Additionally, the base material (semiconductor substrate) forming the main surface corresponding to the semiconductor element formation surface of the semiconductor chip 20 is made of, for example, silicon (Si). Moreover, the plurality of pads 21 are respectively made of metal materials, and in the present embodiment, they are made of, for example, aluminum (Al).

Furthermore, in the example shown in FIG. 3 and FIG. 4, the semiconductor chip 20 is mounted on the wiring substrate 10 by using a so-called face-up packaging method, that is, is mounted on the upper surface 10t of the wiring substrate 10, with the rear surface 20b being opposed to the upper surface 10t of the wiring substrate 10. The semiconductor chip 20 is fixed on the upper surface 10t of the chip mounting region, with an adhesive material 50 (see FIG. 4)

interposed therebetween. The adhesive material 50 is not particularly limited as long as it can fix the semiconductor chip 20 onto the upper surface 10t of the wiring substrate 10; however, in the present embodiment, for example, an epoxy-based thermosetting resin is used.

As shown in FIG. 3 and FIG. 4, the semiconductor chip 20 is electrically connected with the wiring substrate 10, with a plurality of wires 30 interposed therebetween. More specifically, one of the terminals of each wire 30 is connected to the pad 21 exposed on the surface 20t of the semiconductor chip 20. Moreover, the other terminal of the wire 30 is connected to the bonding pad 14 of the wiring substrate 10. The wire 30 is made of metal, such as, for example, gold (Au), copper (Cu) or the like.

Moreover, as shown in FIG. 4, the semiconductor chip 20, the plurality of wires 30 and the plurality of bonding pads 14 are sealed by the sealing member 40. Furthermore, the sealing member 40 is formed on the upper surface 10t of the wiring substrate 10. In the example shown in FIG. 1 and FIG. 4, the sealing member 40 is formed so as to allow the peripheral edge of the upper surface 10t of the wiring substrate 10 to be exposed from the sealing member 40. In this case, however, as a Modification Example relative to FIG. 1 and FIG. 4, the sealing member 40 may be formed so as to coat the entire upper surface 10t of the wiring substrate 10.

<Details of Wiring Configuration of Wiring Substrate>

Next, the following description will explain the wiring configuration of the wiring substrate 10 shown in FIG. 1 to FIG. 4 in detail. In this section, prior to explanation of the detailed configuration of the wiring substrate 10, problems found out by the inventors of the present application will be explained with reference to drawings, and the detailed configuration of the wiring substrate 10 on the present embodiment will then be explained.

Figure 5:
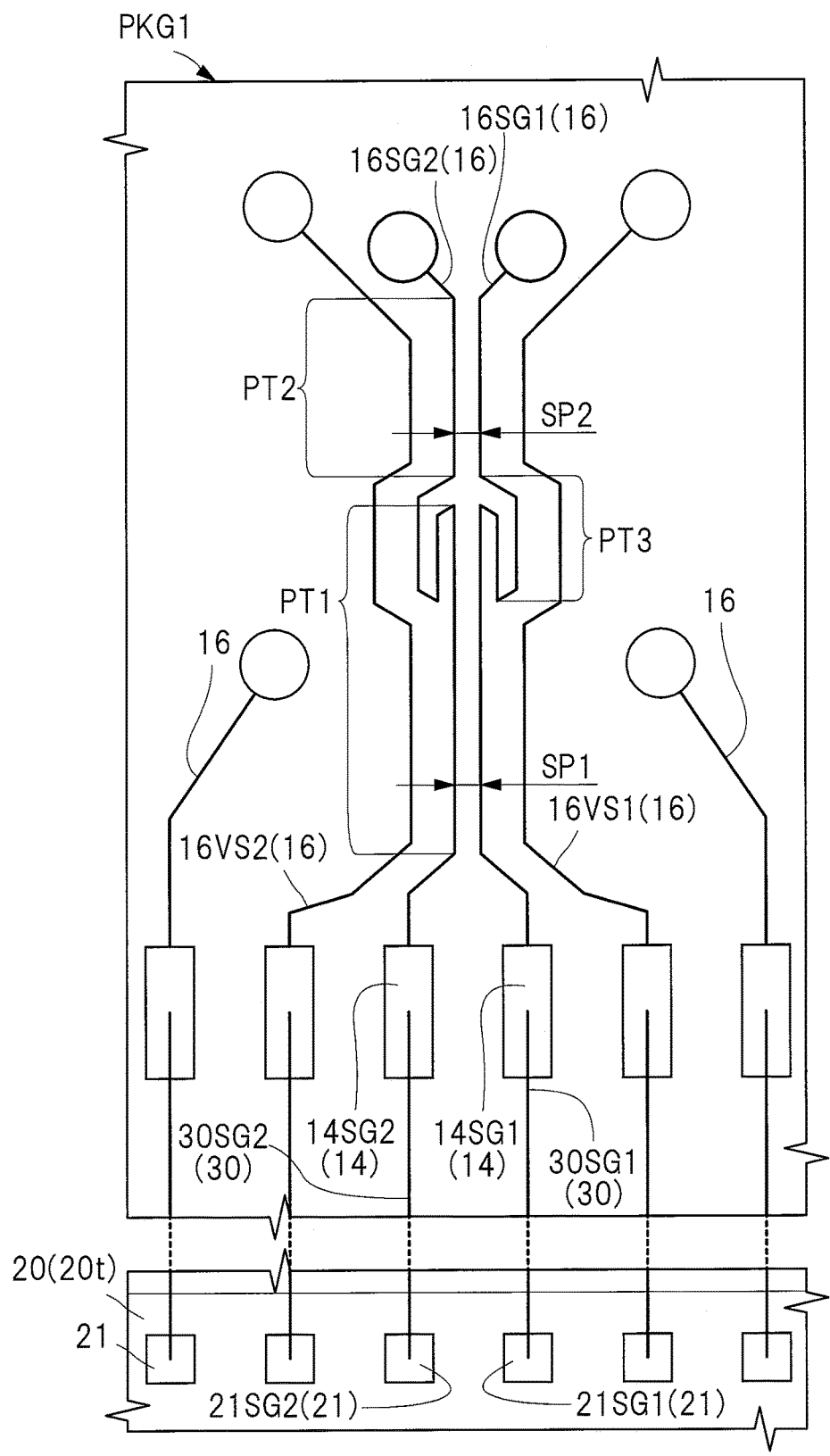
FIG. 5 is an enlarged plan view showing a B portion of FIG. 3.
Figure 6:
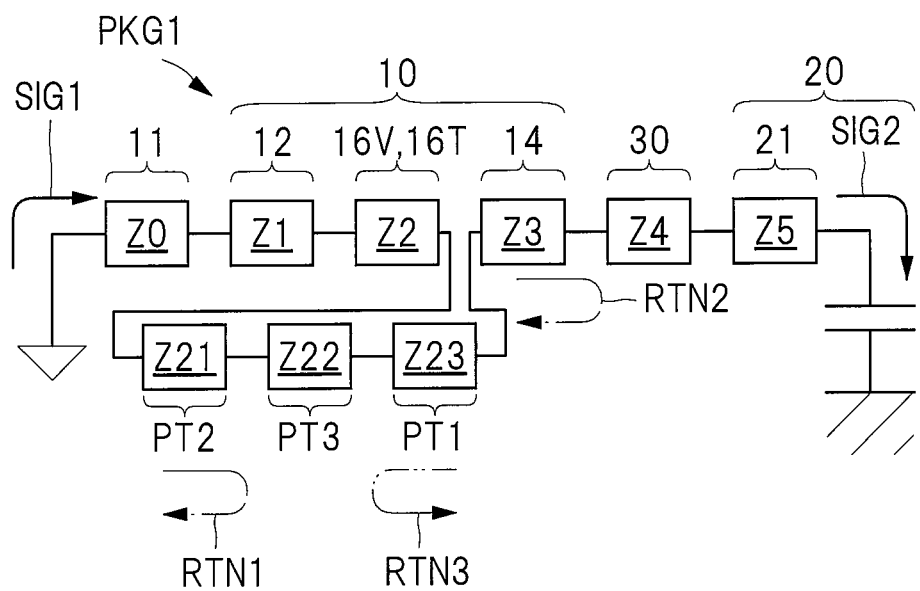
FIG. 6 is a circuit diagram showing a signal transmission path shown in FIG. 5.
Figure 7:
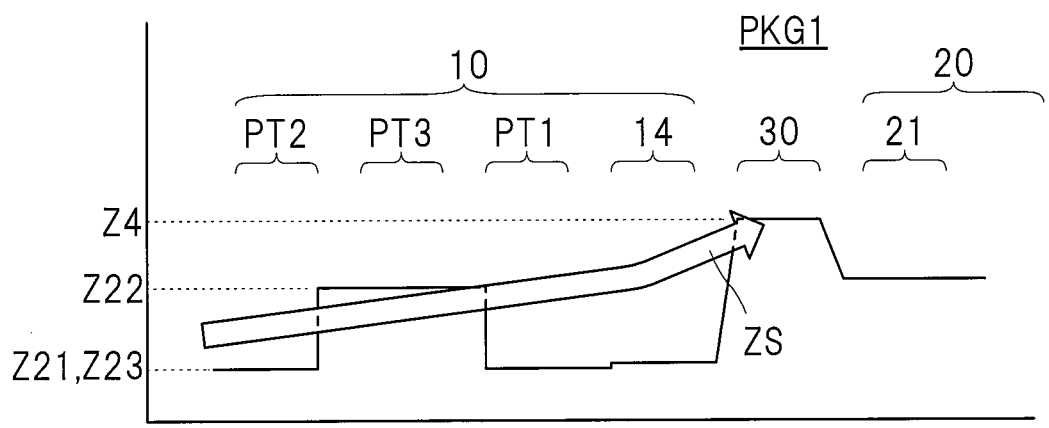
FIG. 7 is an explanatory diagram showing an example of impedance values of respective members shown in FIG. 6.
Figure 8:
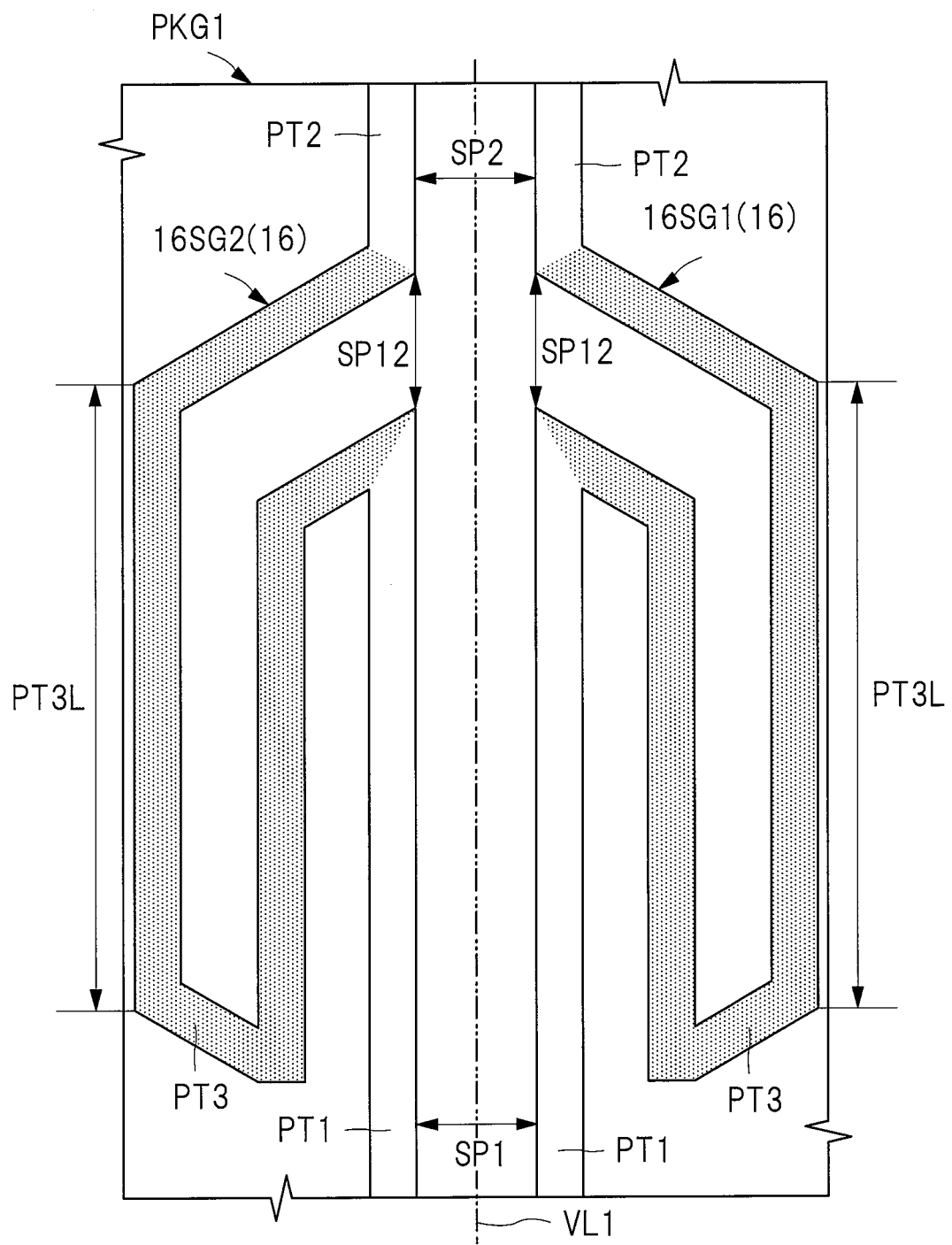
FIG. 8 is an enlarged plan view showing a periphery of detouring portions in an enlarged manner of wirings for use in transmitting the differential signal shown in FIG. 5.
Figure 24:
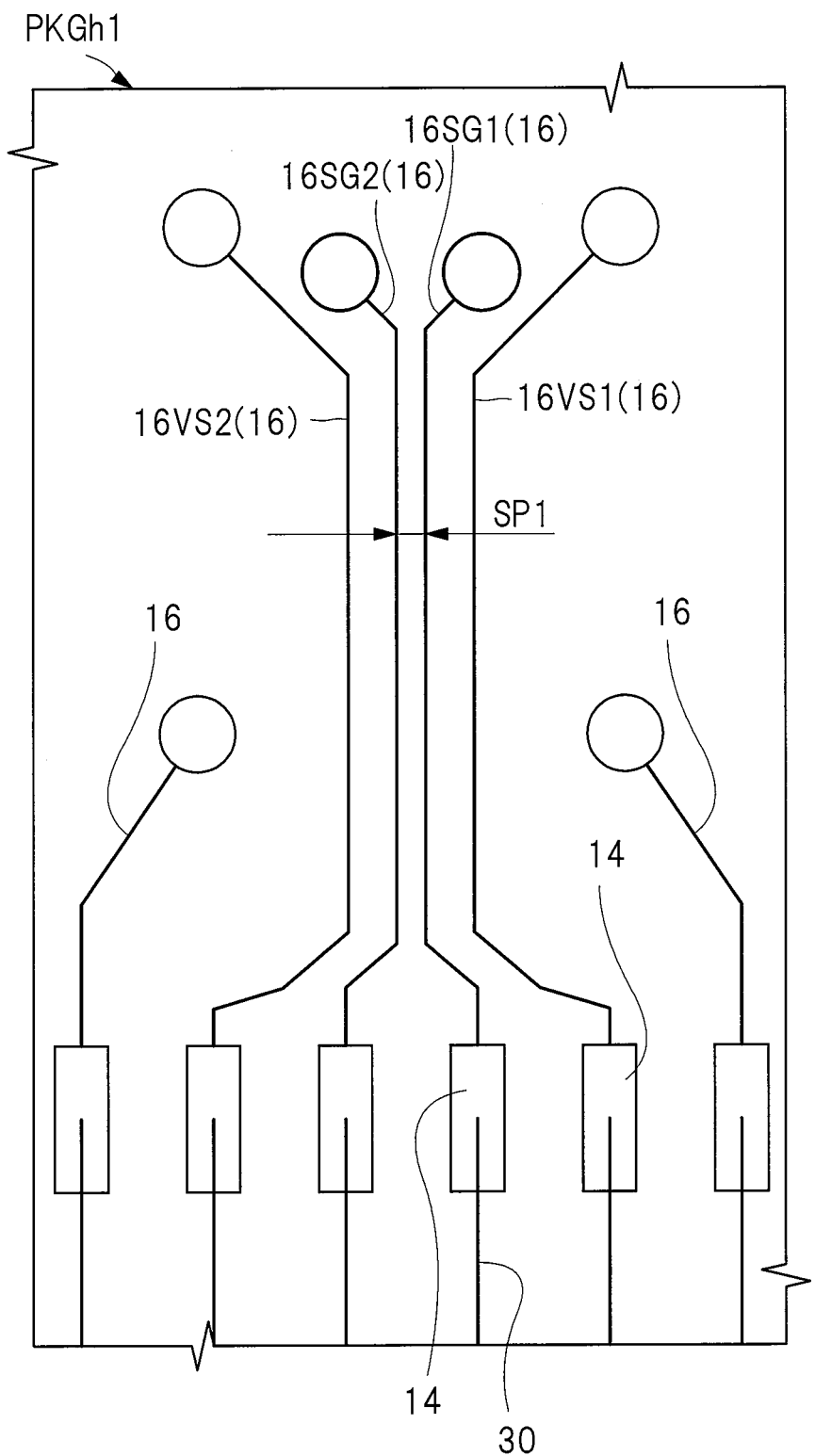
FIG. 24 is an enlarged plan view showing a wiring configuration example of a semiconductor device, which is an examination example relative to FIG. 5.
Figure 25:
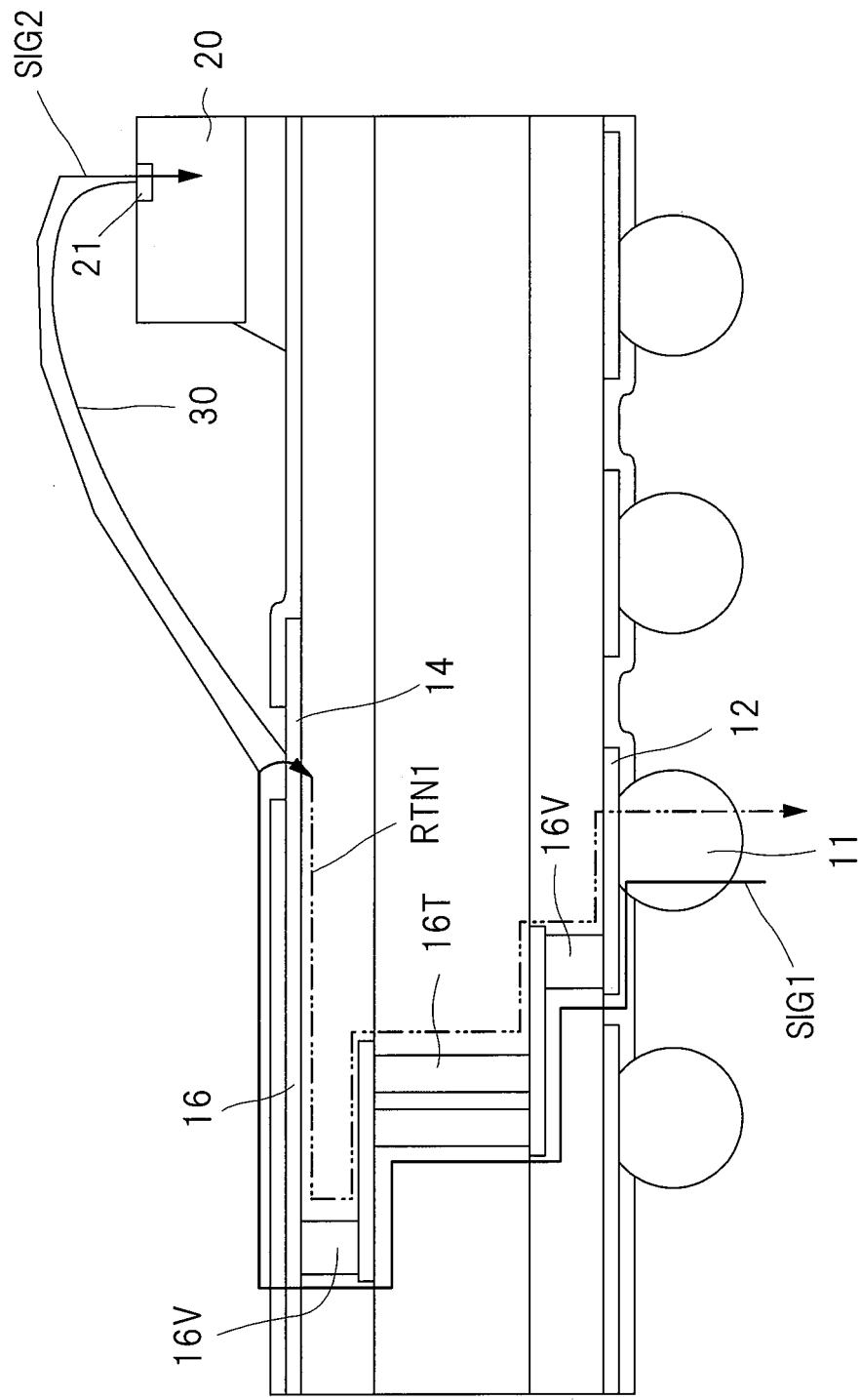
FIG. 25 is an explanatory diagram schematically showing a portion where a signal reflection occurs in the semiconductor device shown in FIG. 24.
Figure 26:
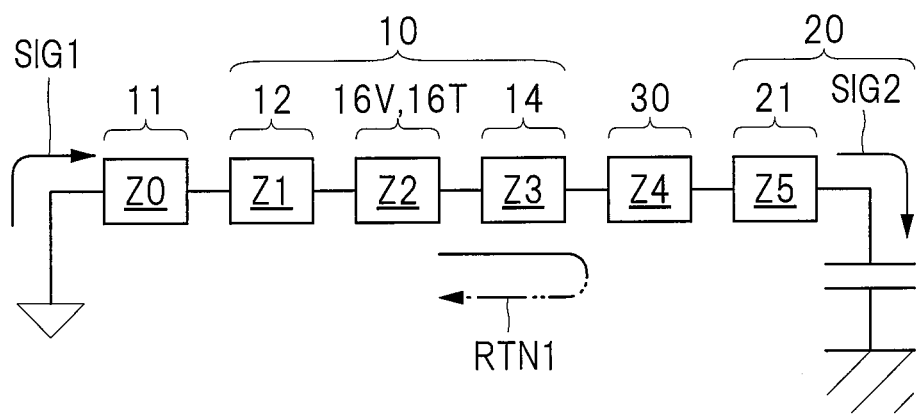
FIG. 26 is a circuit diagram of the signal transmission path shown in FIG. 25.

FIG. 5 is an enlarged plan view of a portion B of FIG. 3. Moreover, FIG. 6 is a circuit diagram of a signal transmission path shown in FIG. 5. FIG. 7 is an explanatory diagram showing an example of impedance values of the respective members shown in FIG. 6. Furthermore, FIG. 8 is an enlarged plan view showing a periphery of detouring portions of the wirings for transmitting differential signals, shown in FIG. 5. FIG. 24 is an enlarged plan view showing a wiring structural example of a semiconductor device that is an examination example relating to FIG. 5. In this case, FIG. 25 is an explanatory diagram that schematically shows a portion where a signal reflection occurs in the semiconductor device shown in FIG. 24. Moreover, FIG. 26 is a circuit diagram of the signal transmission path shown in FIG. 25. Furthermore, FIG. 27 is an explanatory diagram showing an example of impedance values of the respective members shown in FIG. 26.

Figure 27:
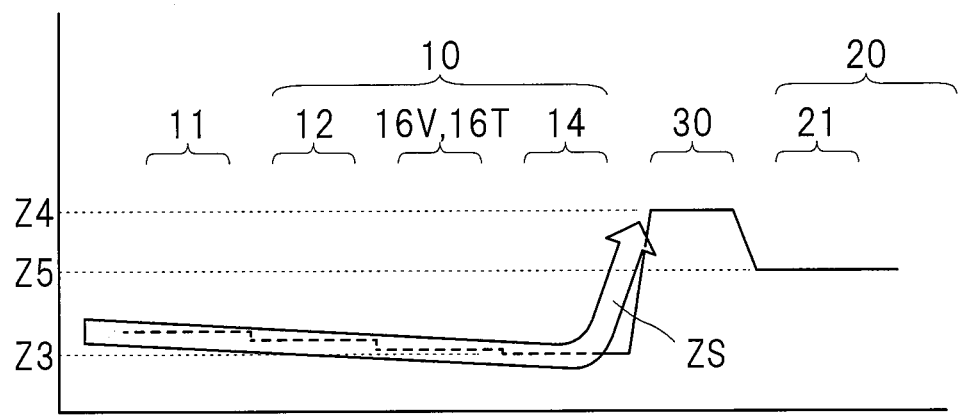
FIG. 27 is an explanatory diagram showing an example of impedance values of respective members shown in FIG. 26.

Additionally, in FIG. 7, among the impedances of the respective members shown in FIG. 6, since the respective portions up to an impedance Z2 are the same as those shown in FIG. 27, the illustrations thereof will be omitted. Moreover, in FIG. 8, in order to make borders among a portion PT1, portion PT2 and portion PT3 easily recognizable, the portion PT3 is indicated with a pattern applied thereto.

The semiconductor device PKG1 of the present embodiment is provided with a signal transmission path for transmitting a differential signal by using two signal lines forming a differential pair, as in the case of the communication system of PCI-Express, USB or the like. Various Modification Examples may be proposed with respect to the transmission speed of the differential signal; however, the semiconductor device PKG1 of the present embodiment is provided with a signal transmission path for transmitting a differential signal, for example, at a transmission speed of about 8 Gbps (8 giga bits per second).

In general, the differential transmission system is a system in which by allowing signal currents having mutually opposite polarities to flow through two signal lines forming a differential pair, the potential difference between the signal lines is detected as a signal. For this reason, the two wirings forming the differential pair are installed so as to extend in parallel with each other with a fixed clearance. For example, of a plurality of wirings 16 which the semiconductor device PKGh1 has as shown in FIG. 24, the wiring 16SG1 and the wiring 16SG2 are installed so as to extend in parallel with each other with a clearance SP1. In this manner, by adjusting the clearance between the differential pair to a fixed value, it is possible to prevent a discontinuous point of the differential impedance from occurring in the transmission path of the differential signal.

However, it is difficult to prevent the impedance discontinuous point from occurring in all the portion of the signal transmission path. For example, as schematically shown in FIG. 25, suppose that an input signal SIG1 is transmitted from the solder ball 11 side toward the semiconductor chip 20. Of the signal transmission path shown in FIG. 25, by installing the wirings forming the differential pair so as to extend in parallel with each other up to a portion connected with the wires 30, it is possible to suppress the occurrence of an impedance discontinuous point as shown in FIG. 27. However, at a portion where the semiconductor chip 20 and the wiring substrate 10 are electrically connected with each other, since the wiring configuration changes greatly, the adjustment of the impedance value becomes difficult, with the result that as shown in FIG. 27, the impedance discontinuous point tends to occur easily. Then, as schematically shown in FIG. 25 and FIG. 26, at the impedance discontinuous point, a signal reflection occurs so that one portion of the input signal SIG1 is reflected in the direction of the solder ball 11 serving as the input terminal as a reflected signal RTN1. For this reason, an input signal SIG2 to be arrived at the semiconductor chip 20 becomes smaller than the input signal SIG1. That is, by the occurrence of the impedance discontinuous point, a return loss characteristic of the signal transmission path is lowered.

In particular, in the case when the semiconductor chip 20 and the wiring substrate 10 are electrically connected with each other via the wires 30, the portions of the wires 30 have a greater impedance value in comparison with the other portions as shown in FIG. 27. Since the wires 30 are metal members having a thin linear form, the cross sectional area (line diameter) is small (for example, smaller than the cross sectional area of the wiring 16SG1 or 16SG2), with the result that the transmission path is extended longer. This fact is considered to be one of the reasons why the impedance becomes greater at the portion of the wires 30. Moreover, in the case when, as shown in FIG. 3, the arrangement pitches of the bonding pads 14 and the pads 21 of the semiconductor chip 20 are different from each other, it becomes difficult to allow the adjacent wires 30 to extend in parallel with each other. For this reason, the value of the differential impedance easily changes at the portion of the wires 30. In the example shown in FIG. 27, a difference between an impedance Z4 of the portion of the wires 30 and an impedance Z3 of the portion of the bonding pads 14 is greater than the difference in impedance values at the other portion. In this manner, when there is the impedance discontinuous point where the impedance value changes greatly, the degree of return loss becomes greater because of a greater reflection amount of the signal.

Therefore, the inventors of the present application have examined a technique for suppressing the reflection of the signal and for consequently improving the return loss characteristic of the signal transmission path. As a result, it is found that by installing a portion having a great impedance value between the impedance discontinuous point where the difference in impedance values changes greatly and the input portion, the reflection amount of the signal can be reduced in the signal transmission path as a whole. Referring to FIG. 5 to FIG. 8, a detailed explanation will be given below.

As shown in FIG. 5, the plurality of pads 21 which the semiconductor chip 20 of the semiconductor device PKG1 of the present embodiment has include pads 21SG1 and pads 21SG2 each of which is next to each pad 21SG1. The pad 21SG1 and the pad 21SG2 form a differential pair for transmitting a differential signal. Moreover, the plurality of bonding pads 14 include bonding pads 14SG1 each of which is electrically connected with the pad 21SG1 via each wire 30SG1 of the plurality of wires 30, and bonding pads 14SG2 each of which is electrically connected with the pad 21SG2 via each wire 30SG2, and next to each bonding pad 14SG1.

Moreover, as shown in FIG. 5 and FIG. 8, the plurality of wirings 16 include wirings 16SG1 connected to the bonding pads 14SG1 and wirings 16SG2 connected to the bonding pads 14SG2. When seen in a plan view, each of the wirings 16SG1 and each of the wirings 16SG2 respectively have portions (parallel extending portions) PT1 that extend in parallel with each other with a first clearance SP1. Moreover, the wiring 16SG1 and the wiring 16SG2 respectively have portions (parallel extending portions) PT2 that are formed on the same wiring layer as the portions PT1 and extend in parallel with each other with a clearance SP2. Furthermore, the wiring 16SG1 and the wiring 16SG2 respectively have portions (detouring portions) PT3 that are formed between the portions PT1 and the portions PT2 in a manner so as to detour in such a direction as to make the mutual clearance greater than the clearance SP1 and the clearance SP2.

In the case of the wiring configuration shown in FIG. 8, when attention is focused on the differential impedance value of the signal transmission path, a state as exemplified by FIG. 6 and FIG. 7 is given. That is, by installing each of the portions PT3 where the mutual clearance becomes greater in the middle of the wirings forming the differential pair, the differential impedance value becomes greater in the portion PT3. For example, in an example shown in FIG. 7, an impedance Z22 of the portion PT3 is greater than an impedance Z21 of the portion PT1 and an impedance Z23 of the portion PT2. Moreover, an impedance Z22 of the portion PT3 is smaller than an impedance Z4 of the wires 30.

In the case when a signal is inputted to the signal transmission path of the wiring configuration shown in FIG. 5 to FIG. 8, a reflection of the signal is generated as schematically shown in FIG. 6. First, an input signal SIG1 transmitted from the solder ball 11 side is transmitted without causing any particularly great reflection until it has arrived at the portion PT3. However, since a border between the portion PT2 and the portion PT3 corresponds to the impedance discontinuous point where the value of the impedance Z22 changes greatly, one portion of the input signal SIG1 is reflected toward the direction of the solder ball 11 serving as the input terminal as a reflection signal RTN1. However, since the value of the impedance Z22 is smaller than the value of the impedance Z4 of the wires 30, the reflection amount of the reflection signal RTN1 is smaller than that of the reflection signal RTN1 shown in FIG. 26.

Next, a border between each wire 30 and each bonding pad 14 forms the impedance discontinuous point where the value of the impedance Z4 changes greatly. For this reason, one portion of the input signal SIG1 is reflected toward the direction of the solder ball 11 serving as the input terminal as a reflection signal RTN2.

However, in the case of the present embodiment, a border between the portion PT1 and the portion PT3 forms the impedance discontinuous point in the proceeding direction of the reflection signal RTN2. For this reason, one portion of the reflection signal RTN2 is reflected in the direction of the semiconductor chip 20 as a reflection signal RTN3. Since the reflection signal RTN3 that has been again reflected in the direction of the semiconductor chip 20 proceeds in the same direction as that of the input signal SIG1, the value of the input signal SIG2 to be inputted to the semiconductor chip 20 becomes greater than the value of the input signal SIG2 shown in FIG. 26. That is, in the present embodiment, by reflecting the reflection signal RTN2 again at the portion PT3, the amount of return loss is reduced in the signal transmission path as a whole. In other words, according to the present embodiment, it becomes possible to improve the return loss characteristic of the signal transmission path. Moreover, in other words again, in the present embodiment, by installing another impedance discontinuous point between the impedance discontinuous point where the difference in impedance values is great and the input terminal, the signal reflection is apparently cancelled.

In this manner, according to the present embodiment, by intentionally installing an impedance discontinuous point in a transmission path for a differential signal, the return loss characteristic can be improved. Therefore, it becomes possible to improve the signal transmission characteristic of a semiconductor device.

Moreover, in the signal transmission paths shown in FIG. 5 to FIG. 8, the following description will examine a case in which a signal is outputted from the semiconductor chip 20 side toward the solder ball 11 side. That is, an output signal (illustration is abbreviated) outputted from the semiconductor chip 20 shown in FIG. 6 is partially reflected at a portion of the wires 30. However, the impedance difference between the semiconductor chip 20 and the wires 30 is smaller than an impedance difference between the wires 30 and the wiring substrate 10. Therefore, the reflection amount of the output signal at the wires 30 is small. Next, an output signal is partially reflected at the portion PT3 of the wiring substrate 10. However, the reflection signal reflected at the portion PT3 is again reflected at a border relative to the wires 30, and proceeds in the direction toward the solder ball 11. As a result, the output signal that arrives on the solder ball 11 side is not so greatly reduced even in the case when the portion PT3 is formed.

In the present embodiment, at the portion PT3 shown in FIG. 8, the wiring 16SG1 and the wiring 16SG2 forming a differential pair are not allowed to extend in parallel with each other. At the portion PT3, the wiring 16SG1 and the wiring 16SG2 detour in such a direction as to make the mutual clearance greater than the clearance SP1 and the clearance SP2. In this manner, when portions of the differential pair are partially not allowed to extend in parallel with each other, the wiring path distance of the portion PT3 that has no parallel extending portions gives a greater influence to the inductance component of the signal transmission path than the wiring path distance of the portions PT1 and PT2 that have parallel extending portions. Moreover, in the case when the wiring pattern of the portion PT3 is formed into a coil shape or a meander shape, the inductance component of the portion PT3 can be further made greater depending on the shape. That is, according to the present embodiment, the value of the impedance Z22 can be easily controlled by adjusting the wiring path distance to be detoured or the shape of the wiring pattern at the detoured portion.

For example, in the example shown in FIG. 8, each of the wiring 16SG1 and the wiring 16SG2 has such a meander shape at the portion PT3 as to meander in mutually separating directions. That is, in the example shown in FIG. 8, the portion PT3 has an intersecting portion that extends in a direction intersecting with the extending direction of the PT1 and a parallel extending portion that extends along the portion PT1. Additionally, in FIG. 8, the parallel extending portion extends relative to the portion PT1; however, as a Modification Example, the parallel extending portion may extends in parallel with the portion PT2. In this case, by adjusting a length PT3L of the parallel extending portion, the inductance of the portion PT3 can be adjusted.

Moreover, in the present embodiment, a clearance SP12 between the portion PT1 and the portion PT2 is made sufficiently small. In the example shown in FIG. 8, the clearance SP12 is about the same level as the clearance SP1 and the clearance SP2, and is made smaller than, for example, the length PT3L of the parallel extending portion of the portion PT3. In this manner, in the case when the clearance SP12 of the portion PT1 and the portion PT2 is small, the portion PT3 that corresponds to the detouring portion may be regarded as a coil as a circuit in terms of the circuit. That is, according to the example shown in FIG. 8, the inductance of the coil is added to the portion PT3 constituting the transmission path for the differential signal.

Furthermore, the impedance of the signal transmission path includes a capacitance component, a resistance component and an inductance component. According to the examination carried out by the inventors of the present application, from the viewpoint of controlling the reflection amount of the signal transmission path and consequently reducing the return loss, a method for mainly adjusting the inductance component of the impedance component as described by the present embodiment is found to be particularly effective.

In the case when a differential signal is transmitted, the lengths of the respective transmission paths forming the differential pair and the values of the impedances in the respective paths are preferably set to the same values respectively. Therefore, the shapes of the wiring 16SG1 and the wiring 16SG2 forming the differential pair are preferably set to be linearly symmetrical shapes relative to a virtual line VL1 (see FIG. 8) in the center of the wiring 16SG1 and the wiring 16SG2. However, in the case when the lengths of the respective transmission paths and the impedance values in the respective paths are adjusted to such a degree as to be regarded as effectively the same, the shapes of the wiring 16SG1 and the wiring 16SG2 are not necessarily required to be linearly symmetrical.

Moreover, in the present embodiment, the portion PT1, portion PT2 and portion PT3 are respectively formed on the same wiring layer. For this reason, a via wiring 16V, a through hole wiring 16T and the like shown in FIG. 4 are not included in the portion PT3. At a portion where an interlayer conductive path, such as the via wiring 16V, the through hole wiring 16T or the like, is formed, a conductor pattern for use in connecting the interlayer conductive paths is required. Since this conductor pattern has a larger area in comparison with the wiring 16, a capacitive impedance component is formed. In this case, when the capacitive impedance component is contained in the portion PT3, the control of the differential impedance value becomes more complicated. On the other hand, in the case when the portion PT1, portion PT2 and portion PT3 are formed on the same wiring layer as in the case of the present embodiment, the inductance can be easily controlled by adjusting the shape and the length of the wiring pattern.

Moreover, in the example shown in FIG. 5, the portion PT1, portion PT2 and portion PT3 are formed on the same wiring layer. In other words, the portion PT1, portion PT2 and portion PT3 are formed on the same wiring layer as the bonding pads 14. In other words again, in the present embodiment, the portion PT1, portion PT2 and portion PT3 are respectively formed on the same uppermost wiring layer as the bonding pads 14.

As shown in FIG. 6, in the case when a reflection signal RTN2 that supposedly occurs at the joining portion of the bonding pads 14 and the wires 30 is made to be again reflected, from the viewpoint of suppressing the attenuation of the reflection signal RTN2, the distance between the wires 30 and the portion PT3 is preferably set to be as short as possible. Therefore, in the case when the portion PT1, portion PT2 and portion PT3 are respectively formed on the same uppermost wiring layer as the bonding pads 14 as in the case of the present embodiment, the distance between the wires 30 and the portion PT3 can be made short so that the attenuation of the reflection signal RTn2 can be suppressed. In the present embodiment, as described above, one portion of the reflection signal RTN2 is reflected toward the direction of the semiconductor chip 20 as the reflection signal RTN3 to become one portion of the input signal SIG2 to be inputted to the semiconductor chip 20. Therefore, by suppressing the attenuation of the reflection signal RTN2, the loss of the input signal SIG2 to be inputted to the semiconductor chip 20 can be reduced.

Moreover, in the case when the portion PT1, portion PT2 and portion PT3 are respectively formed on the same uppermost wiring layer, since the distance between the impedance Z3 and the impedance Z23 shown in FIG. 6 becomes short, the transmission distance of the reflection signal RTN2 can be made shorter. For this reason, it is possible to reduce influences as a noise source given to other signal transmission paths caused by the reflection signal RTN2 due to its propagation to the peripheral area. In other words, by making the distance between the portion PT1 and the bonding pads 14 as short as possible, the reflection signal RTN2 can be confined into a small range.

Moreover, as schematically shown in FIG. 7 with arrows added thereto, in the case when the impedance discontinuous point is formed in the vicinity of the bonding pads 14, the apparent impedance ZS of the signal transmission path becomes gradually greater toward the impedance Z4 of the wires 30 that form the greatest impedance discontinuous point. In this case, the above-mentioned "apparent impedance ZS" corresponds to an impedance value obtained when from the impedance value in the transmission path, the impedance value of a constituent portion that is so small that influences of which can be ignored from the viewpoint of the signal reflection is removed. Strictly speaking, the impedances of the portion PT1 and the bonding pads 14 are smaller than the impedance of the portion PT3, and by shortening the extending distances of the portion PT1 and the bonding pads 14, these impedance components can be ignored in terms of the circuits. Moreover, the value of the apparent impedance ZS is calculated by averaging impedance values at a plurality of portions, while variations in the local impedance values are ignored.

Moreover, in the case when as shown in FIG. 7, the value of the apparent impedance ZS gradually increases toward the impedance Z4 of the wires 30 forming the greatest impedance discontinuous point, the signal reflection hardly occurs in comparison with the case in which as shown in FIG. 27, the value of the impedance ZS abruptly increases at the border of the wires 30 and the bonding pads 14.

In other words, in the case when the portion PT1, portion PT2 and portion PT3 are respectively formed on the same uppermost wiring layer as the bonding pads 14, the amount of reflection of the reflection signal RTN2 generated at the border of the bonding pads 14 and the wires 30 shown in FIG. 6 can be reduced.

In this case, however, as a Modification Example relative to the present embodiment, the portion PT1, portion PT2 and portion PT3 may be formed on a wiring layer other than the uppermost layer. For example, of the plurality of wiring layers shown in FIG. 4, the portion PT1, portion PT2 and portion PT3 may be formed on the wiring layer of the upper surface or the lower surface of the insulating layer 17 in the middle serving as the core material. Alternatively, when a space where the portion PT1, portion PT2 and portion PT3 are disposed can be ensured, on the lowermost wiring layer, that is, on the same wiring layer as the plurality of lands 12 shown in FIG. 4, the portion PT1, portion PT2 and portion PT3 may be formed. In this manner, even when the portion PT1, portion PT2 and portion PT3 are formed on the wiring layer other than the uppermost layer, the effect for reflecting the reflection signal RTN2 again as shown in FIG. 6 can be obtained.

Moreover, in the example shown in FIG. 5 and FIG. 8, the clearance SP1 and the clearance SP2 of the wirings 16SG1 and 16SG2 are equal to each other. In the case when in the middle of the signal transmission path, the portion PT3 that causes a great impedance value is installed as in the case of the present embodiment, the impedance values of the portion PT1 and the portion PT2 may be different from each other. Therefore, the clearance SP1 and the clearance SP2 may be different from each other. However, from the viewpoint of adjusting the value of the signal transmission path as a whole to a predetermined value (for example, 50Ω), the clearance SP1 and the clearance SP2 are preferably set to be equal to each other.

Furthermore, in an attempt to carry out a signal transmission at a high speed as in the case of the present embodiment, it is necessary to reduce influences of cross-talk noise from another wiring 16 (see FIG. 5). In order to reduce the influences of cross-talk noise, it is preferable to widen the clearance between wirings; however, in this case, the wiring density is lowered. Therefore, from the viewpoint of increasing the wiring density, as well as reducing the influences from cross-talk noise, reference potential-use wirings 16VS1 and 16VS2 are preferably installed on the both next sides of the differential pair, as shown in FIG. 5. For example, in the example of FIG. 5, the reference potential-use wiring 16VS1 is formed along the wiring 16SG1 and the reference potential-use wiring 16VS2 is formed along the wiring 16SG2, in a manner so as to extend in parallel with each other. Moreover, to the wiring 16VS1 and the wiring 16VS2, for example, a ground potential is supplied as a reference potential. In this manner, by installing the wirings 16VS1 and 16VS2 to which the reference potential is supplied on the both next sides of the differential pair, it becomes possible to reduce influences of cross-talk noise from another wiring, even when the other wiring is located near the differential pair.

Moreover, in the example shown in FIG. 5, the wiring 16SG1 and the wiring 16SG2 are installed between the wiring 16VS1 and the wiring 16VS2. In the transmission path for the differential pair, by allowing the wirings forming the differential pair to extend in parallel with each other, such a configuration as to cancel mutual noises can be provided. On the other hand, the wiring 16SG1 and the wiring 16SG2 are required to have a function for shielding influences of electromagnetic waves from the outside given to the differential pair. Therefore, in the case when the reference potential-use wirings 16VS1 and 16VS2 are installed along the differential pair, the differential pair needs to be installed between the wiring 16VS1 and the wiring 16VS2, together with the detoured portion PT3.

Although not shown in drawings, if the clearance between wirings can be formed to be sufficiently wide, when seen in a plan view, the reference potential-use wiring 16VS1 and wiring 16VS2 need not be installed.

<Manufacturing Method of Semiconductor Device>

Figure 9:
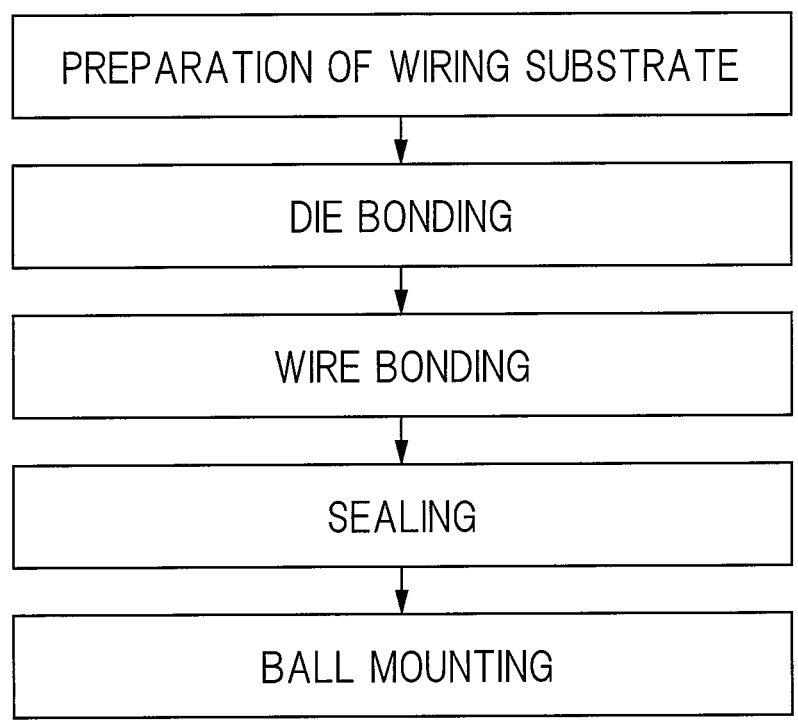
FIG. 9 is an explanatory diagram showing an outline of manufacturing processes of the semiconductor device explained with reference to FIGS. 1 to 8.

Next, the following description will explain manufacturing processes of the semiconductor device PKG1 explained with reference to FIGS. 1 to 8. The following explanation will be given with reference to a flow chart showing the flow of the manufacturing processes and FIG. 1 to FIG. 8, if necessary. FIG. 9 is an explanatory diagram showing the outline of the manufacturing processes of the semiconductor device explained with reference to FIG. 1 to FIG. 8. Additionally, in the present embodiment, for simplicity of explanation, the explanation will be given on a mode of embodiment in which a semiconductor chip 20 is mounted on a wiring substrate 10 shown in FIG. 3. However, as a Modification Example, another method is proposed in which by preparing a so-called multi-piece obtaining substrate corresponding to the wiring substrate 10 where a plurality of product formation regions are formed and after assembling a plurality of semiconductor devices thereon at one time, individual pieces are obtained for the respective product formation regions. In this case, it is possible to improve the efficiency of the assembling process.

<Preparation of Wiring Substrate>

First, in a wiring substrate preparation process, a wiring substrate 10 shown in FIG. 3 is prepared. On the wiring substrate 10 prepared in the present process, a chip mounting region (planned region on which a semiconductor chip 20 shown in FIG. 3 is mounted) is formed on the upper surface (surface, chip mounting surface) 10t side, and on the periphery of the chip mounting region, a plurality of bonding pads 14 exposed from an insulating film (solder resist film) 15 at opening portions are formed. Moreover, on the lower surface (rear surface, packaging surface) 10b (see FIG. 4) on the side opposite to the upper surface 10t of the wiring substrate 10, a plurality of lands (terminals, external terminals, external electrodes) 12 are formed. In the present process, onto the plurality of lands 12, solder balls 11 shown in FIG. 4 are not connected, and the plurality of lands 12 are respectively exposed from the insulating film (solder resist film) 13 at the opening portions.

Moreover, on the wiring substrate 10 prepared in the present process, a plurality of wirings 16 explained with reference to FIG. 5 to FIG. 8 have already been formed. As shown in FIG. 5, the plurality of wirings 16 include the wiring 16SG1 and the wiring 16SG2 forming a transmission path for a differential signal. Moreover, the plurality of wirings 16 also include the wiring 16VS1 and the wiring 16VS2 forming a supply path of a reference potential.

<Die Bonding>

Next, in a die bonding process, as shown in FIG. 3 and FIG. 4, the semiconductor chip 20 is mounted on the upper surface 10t of the wiring substrate 10. In the present embodiment, the semiconductor chip 20 is mounted by using a so-called face-up packaging method such that the rear surface 20b (see FIG. 4) of the semiconductor chip 20 and the upper surface 10t of the wiring substrate 10 are respectively opposed to each other. Moreover, in the example shown in FIG. 4, the semiconductor chip 20 is bonded and secured onto the upper surface 10t of the wiring substrate 10 with an adhesive material 50 interposed therebetween. The adhesive material 50 is made of, for example, a thermosetting resin, such as an epoxy resin.

<Wire Bonding>

Next, in a wire bonding process, as shown in FIG. 3 and FIG. 4, the plurality of pads 21 formed on the surface 20t of the semiconductor chip 20 and the plurality of bonding pads 14 disposed on the periphery of the semiconductor chip 20 are respectively electrically connected via a plurality of wires (conductive members) 30.

In the present process, one end of each of the wires 30 made of a metal material such as, for example, gold (Au) or copper (Cu) is joined to the pad 21 of the semiconductor chip 20, with the other end being joined to the bonding pad 14 of the wiring substrate 10. As the joining method, for example, a method for forming a metallic bond by applying ultrasonic waves to a joining portion, a method for carrying out a thermo-compression, a method for using ultrasonic waves and the thermo-compression in combination, or the like may be used. Additionally, in FIG. 4, a method using a so-called positive bonding method in which one portion (one end) of the wire 30 is first connected to the pad 21 is shown. However, as a Modification Example, a so-called reverse bonding method in which the bonding pad 14 and one end of the wire 30 are first connected to each other may be used.

<Sealing Process>

Next, in a sealing process, as shown in FIG. 4, the semiconductor chip 20, the plurality of wires 30 and the plurality of bonding pads 14 are sealed by using a resin so that a sealed body 40 is formed. In the present process, the semiconductor chip 20, the plurality of wires 30 and the plurality of bonding pads 14, mounted over the upper surface 10t of the wiring substrate 10, are sealed by the resin.

Moreover, in the present process, by using a molding metal mold provided with an upper mold (first mold) with cavities formed thereon and a lower mold (second mold), the sealed body 40 is formed by a so-called transfer molding method. More specifically, in the present process, after softened resin has been press-inserted into the cavities of the molding metal mold in a state in which the wiring substrate 10 is sandwiched by the molding metal mold, the resin is cured so that the sealed body 40 is produced. Thereafter, when the molding metal mold and the wiring substrate 10 are separated from each other, the sealed body 40 in which the semiconductor chip 20 is sealed is produced as shown in FIG. 4.

<Ball Mounting Process>

Next, in a ball mounting process, as shown in FIG. 4, a plurality of solder balls 11 to be formed into external terminals are joined to the plurality of lands 12 formed on the lower surface 10b of the wiring substrate 10.

In the present process, after setting the wiring substrate 10 with its lower surface 10b facing up, the solder balls 11 are respectively disposed on the plurality of lands 12 exposed on the lower surface 10b of the wiring substrate 10. Thereafter, by heating the plurality of solder balls 11, the plurality of solder balls 11 and the lands 12 are joined with each other. By the present process, the plurality of solder balls 11 are electrically connected with the semiconductor chip 20 via the wiring substrate 10.

However, a technique explained in the present embodiment is not applied only to the semiconductor device of a so-called BGA (Ball Grid Array) type in which the solder balls 11 are joined into an array form. As a Modification Example relating to the present embodiment, the technique may be applied to, for example, a semiconductor device of a so-called LGA (Land Grid Array) type in which without forming the solder balls 11, the substrate with the lands 12 being exposed, or the substrate in which a solder paste having a thickness thinner than the solder balls 11 is applied to the lands 12 is shipped. In the case of the semiconductor device of the LGA type, the ball mounting process may be omitted.

The above description has specifically explained the invention made by the inventors of the present invention based upon the embodiments; however, the present invention is not intended to be limited by the above-mentioned embodiments, and it is needless to say that various modifications may be made therein within a scope without departing from the gist of the present invention.

Modification Example 1

For example, in FIG. 5, an explanation has been given by exemplifying a configuration in which the portion PT3 forming an impedance discontinuous point is formed at one portion of each of the wiring 16SG1 and the wiring 16SG2 for use in transmitting a differential signal. However, as in the case of a semiconductor device PKG2 of Modification Examples shown in FIG. 10 to FIG. 12, portions PT3 and PT5 forming the impedance discontinuous points may be formed at a plurality of portions of the respective wiring 16SG1 and wiring 16SG2.

Figure 10:
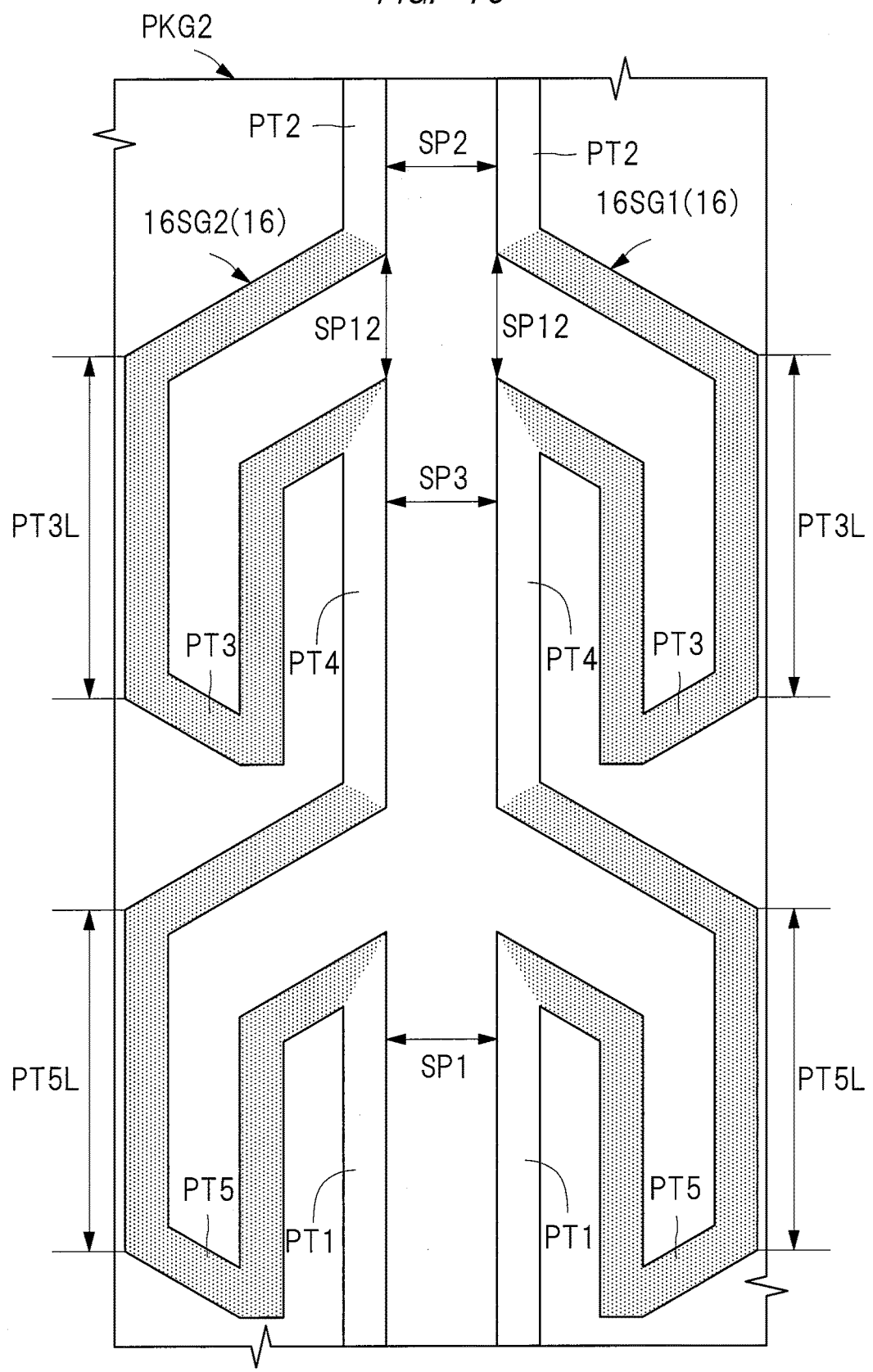
FIG. 10 is an enlarged plan view showing one portion of a transmission path of the differential signal in a semiconductor device, which is a Modification Example relative to FIG. 8.
Figure 11:
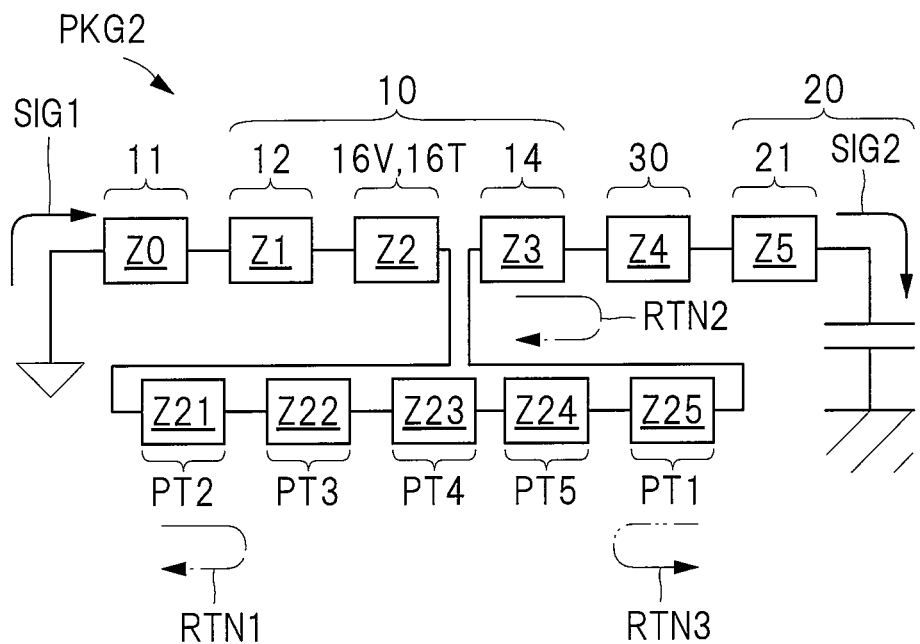
FIG. 11 is a circuit diagram showing the signal transmission path shown in FIG. 10.

FIG. 10 is an enlarged plan view showing one portion of a transmission path in an enlarged manner of a semiconductor device serving as a Modification Example relative to FIG. 8. Moreover, FIG. 11 is a circuit diagram of the signal transmission path shown in FIG. 10. Furthermore, FIG. 12 is an explanatory diagram showing examples of impedance values of the respective members shown in FIG. 11.

The semiconductor device PKG2 shown in FIG. 10 differs from the semiconductor device PKG1 shown in FIG. 8 in that between the bonding pads 14 to which the wires 30 (see FIG. 11) are connected and the solder balls 11 (see FIG. 11) serving as external terminals, a plurality of impedance discontinuous points are formed. More specifically, each of the wiring 16SG1 and the wiring 16SG2 which the semiconductor device PKG2 has is further provided with a portion PT4 that is formed between the portion PT1 and the portion PT3, and extends in parallel with one another with a clearance SP3. Moreover, the wiring 16SG1 and the wiring 16SG2 which the semiconductor device PKG2 has are further provided with portions PT4 that are formed between the portion PT1 and the portion PT3, and extend in parallel with each other with a clearance SP3. Furthermore, the wiring 16SG1 and the wiring 16SG2 are further provided with portions PT5 that are formed between the portion PT4 and the portion PT1, and designed to detour in such a direction as to make a mutual clearance become greater than the clearance SP1, the clearance SP2 and the clearance SP3. Additionally, the clearances SP1, SP2 and SP3 may be set to respectively different values; however, in the example shown in FIG. 10, the clearances SP1, SP2 and SP3 are set to the same value.

Moreover, the portions PT1, PT2, PT3, PT4 and PT5 shown in FIG. 10 are respectively formed on the uppermost layer, that is, on the same wiring layer as the bonding pads 14 (see FIG. 11). In other words, in the examples shown in FIG. 10 to FIG. 12, a plurality of impedance discontinuous points are formed in the vicinity of the bonding pads 14 to which the wires 30 are connected. As schematically shown in FIG. 12 with arrows being attached thereto, in the case when the plurality of impedance discontinuous points are formed in the vicinity of the bonding pads 14, the apparent impedance ZS of the signal transmission path gradually increases toward the impedance Z4 of the wires 30 forming the greatest impedance discontinuous point. In this case, as described earlier, the "apparent impedance ZS" corresponds to an impedance value obtained when from the impedance value in the transmission path, the impedance value of a constituent portion that is so small that influences of which can be ignored from the viewpoint of the signal reflection is removed. Strictly speaking, the impedances of the portion PT1 and the bonding pads 14 are smaller than the impedance of the portion PT3 and the portion PT5, and by shortening the extending distances of the portion PT1 and the bonding pads 14, these impedance components can be ignored in terms of the circuits. Moreover, the value of the apparent impedance ZS is calculated by averaging impedance values at a plurality of portions, while variations in the local impedance values are ignored.

Figure 12:
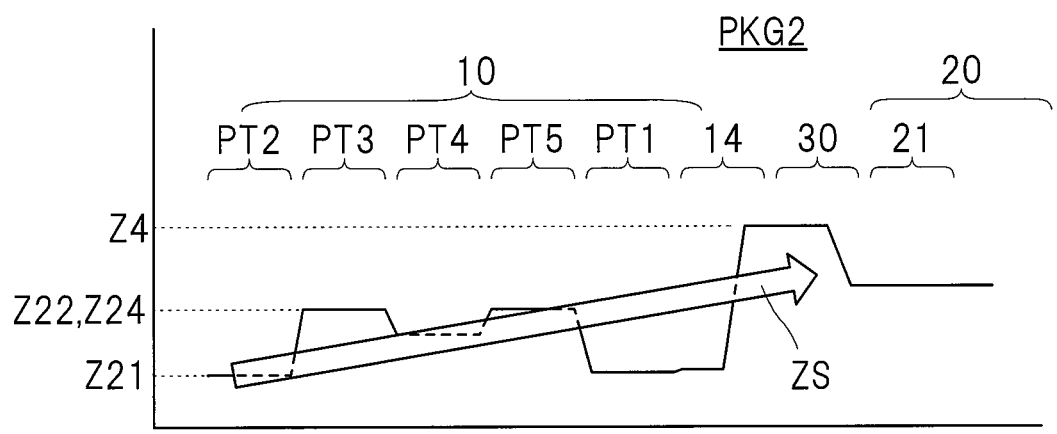
FIG. 12 is an explanatory diagram showing an example of impedance values of respective members shown in FIG. 11.

Moreover, in the case when as shown in FIG. 12, the value of the apparent impedance ZS gradually increases toward the impedance Z4 of the wires 30 forming the greatest impedance discontinuous point, the signal reflection hardly occurs in comparison with a case in which as shown in FIG. 27, the value of the impedance ZS abruptly increases at the border of the wires 30 and the bonding pads 14. Furthermore, it is understood that the impedance ZS shown in FIG. 12 becomes further linearly greater than the impedance ZS shown in FIG. 7.

In other words, according to the Modification Examples shown in FIG. 10 to FIG. 12, in comparison with the semiconductor device PKG1 shown in FIG. 7, the amount of reflection of the reflection signal RTN2 occurring at the border between the bonding pads 14 and the wires 30 shown in FIG. 11 can be further reduced.

In this case, the portion PT5 and the portion PT3 shown in FIG. 10 have the same shape. Each of the portion PT3 and the portion PT5 has an intersecting portion that extends in a direction intersecting with the extending direction of the portion PT4 and a parallel extending portion that extends along the portion PT4 or the portion PT1. Moreover, the length PT3L of the parallel extending portion of the portion PT3 has the same value as that of the length PT5L of the portion PT5. For this reason, the impedance of the portion PT3 and the impedance of the portion PT5 have the same value. However, since the portion PT3 and the portion PT5 are formed so as to be close to each other, influences of the impedance of the portion PT4 are so small as to be ignored. Therefore, hardly any signal reflection occurs at the border of the portion PT4 and the portion PT5 shown in FIG. 11.

Additionally, as a Modification Example further proposed relative to the present Modification Example 1, the portions PT1, PT2, PT3, PT4 and PT5 may be respectively formed on a wiring layer other than the uppermost layer. In this case, since the path distance from the portion PT5 to the bonding pads 14 becomes longer, it is difficult to allow the value of the apparent impedance ZS to become gradually greater as shown in FIG. 12. However, even in the case when the portion PT5 is formed on the other wiring layer, it functions as the impedance discontinuous point where the reflection signal RTN2 shown in FIG. 11 is again reflected. Therefore, it becomes possible to improve the return loss characteristic of the signal transmission path as a whole.

Moreover, when the distance between the portion PT3 and the bonding pads 14 shown in FIG. 5 is sufficiently short, it is possible to reduce the reflection amount of the reflection signal RTN2 shown in FIG. 6 in the case of the wiring configuration shown in FIG. 5 as well. However, as shown in FIG. 12, from the viewpoint of allowing the value of the impedance ZS to gradually increase, it is preferable to install the plurality of impedance discontinuous points as shown in the present Modification Example.

The configuration of the semiconductor device PKG2 of the Modification Example shown in FIG. 10 is the same as that of the semiconductor device PKG1 shown in FIG. 8, except for the above-mentioned difference. Therefore, the overlapped explanations will be omitted.

Modification Example 2

Figure 13:
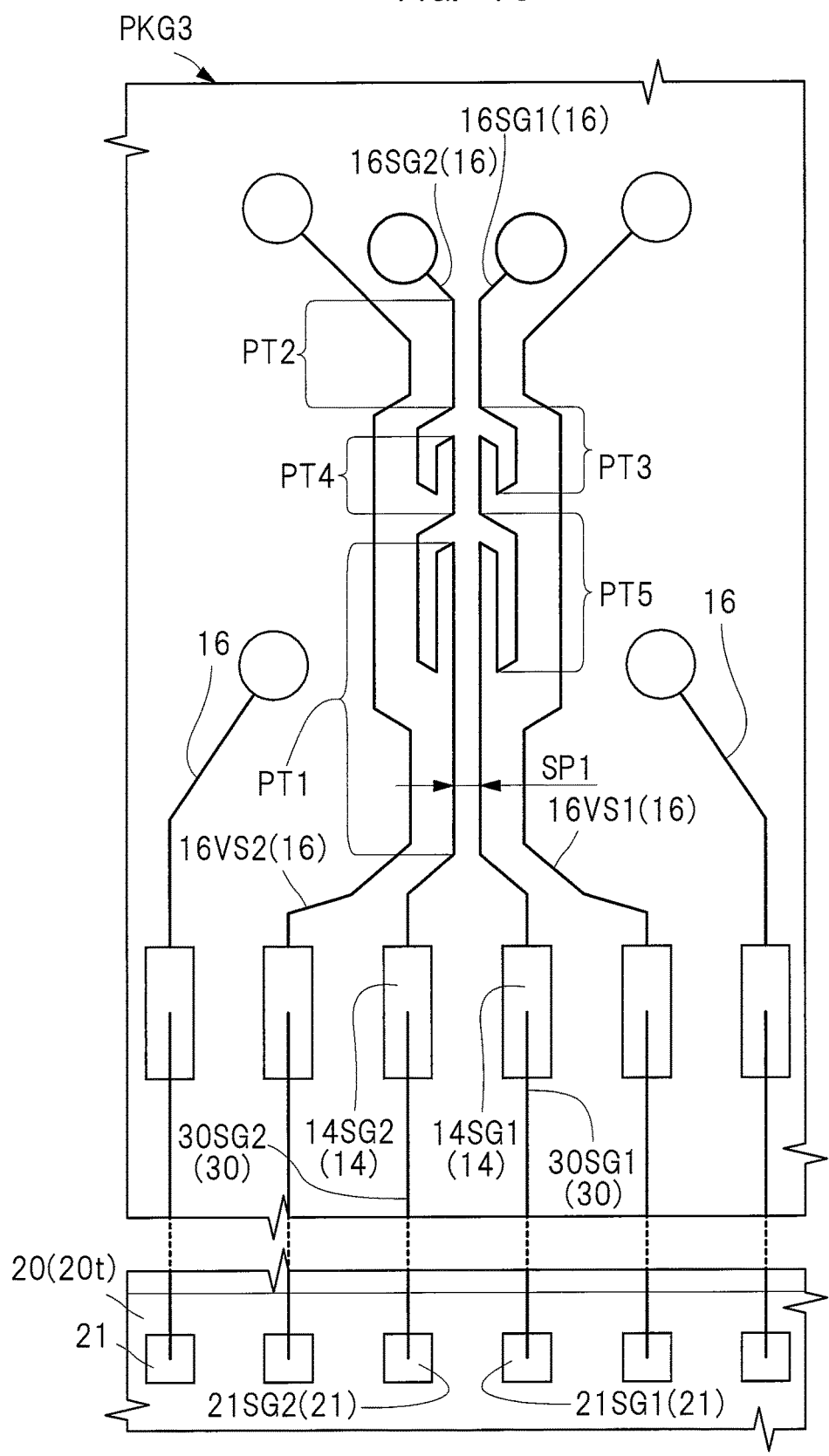
FIG. 13 is an enlarged plan view showing a periphery of a signal transmission path of a semiconductor device, which is a Modification Example relative to FIG. 5.
Figure 14:
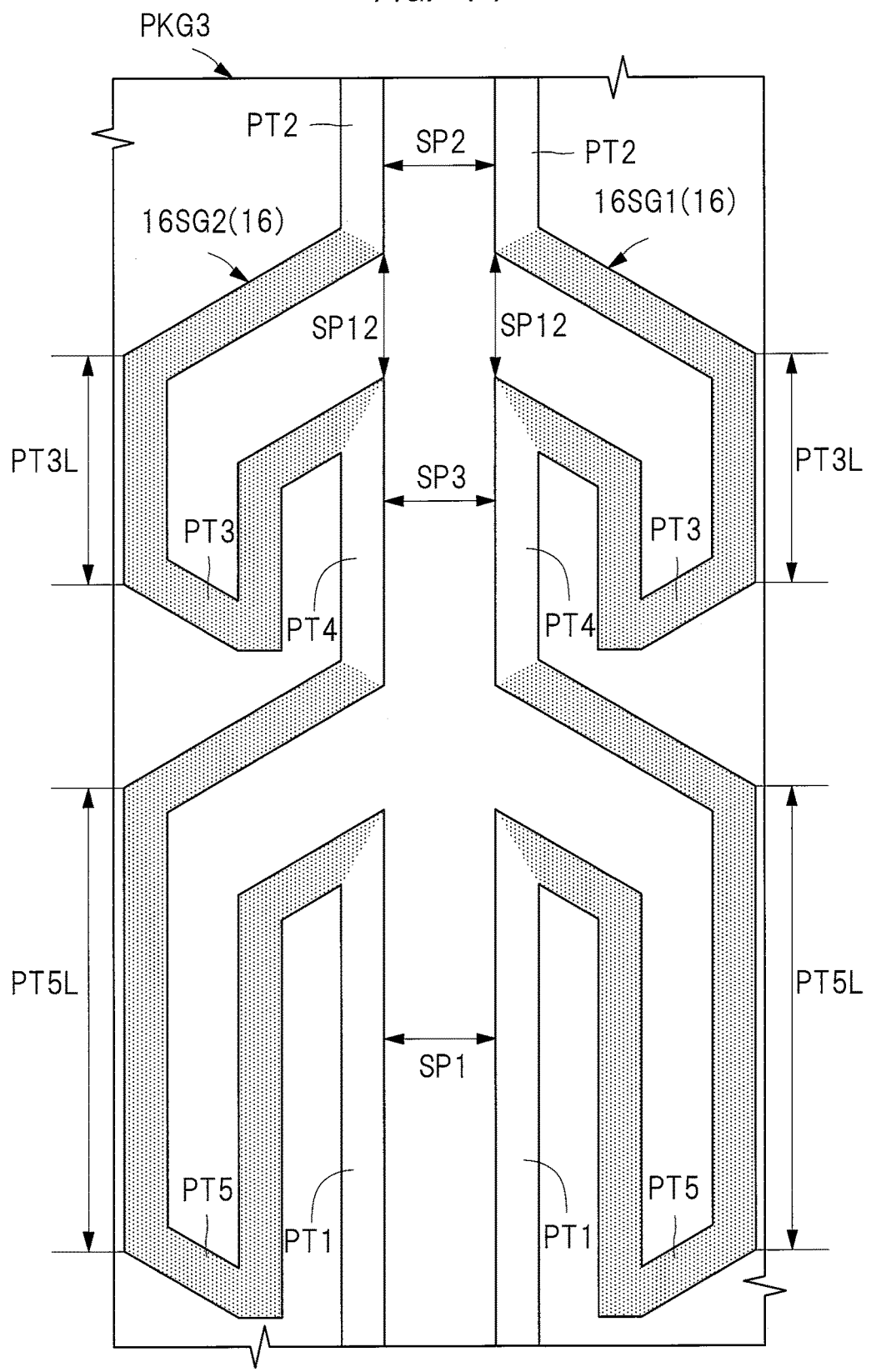
FIG. 14 is an enlarged plan view showing a periphery of detouring portions in an enlarged manner of wirings for use in transmitting a differential signal shown in FIG. 13.
Figure 15:
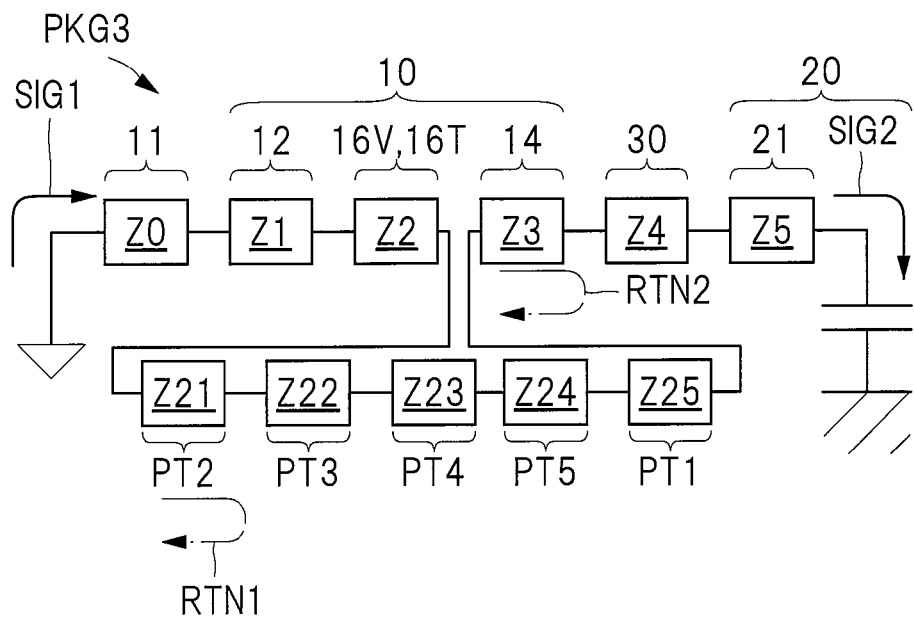
FIG. 15 is a circuit diagram showing a signal transmission path shown in FIG. 13.
Figure 16:
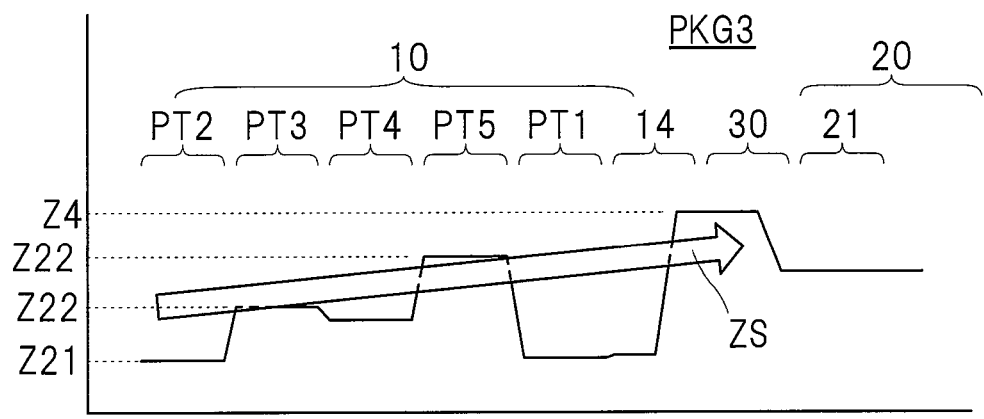
FIG. 16 is an explanatory diagram showing an example of impedance values of respective members shown in FIG. 15.

Next, the following description will explain a Modification Example that makes a change in the apparent impedance further moderate in comparison with the above-mentioned Modification Example 1. FIG. 13 is an enlarged plan view showing the periphery of a signal transmission path of a semiconductor device, which is a Modification Example relative to FIG. 5. Moreover, FIG. 14 is an enlarged plan view showing the periphery of detouring portions in an enlarged manner of wirings for use in transmitting a differential signal shown in FIG. 13. Furthermore, FIG. 15 is a circuit diagram showing a signal transmission path shown in FIG. 13. FIG. 16 is an explanatory diagram showing an example of impedance values of respective members shown in FIG. 15.

The semiconductor device PKG3 shown in FIG. 13 to FIG. 16 differs from the semiconductor device PKG1 shown in FIG. 10 to FIG. 12 in that impedance values of the plurality of impedance discontinuous points formed between the bonding pads 14 to which the wires 30 (see FIG. 15) are connected and the solder balls 11 (see FIG. 15) serving as external terminals are different from one another. More specifically, the portion PT5 and the portion PT3 shown in FIG. 14 have different shapes. Each of the portion PT3 and the portion PT5 has an intersecting portion that extends in a direction intersecting with the extending direction of the portion PT4 and a parallel extending portion that extends along the portion PT4 or the portion PT1. Moreover, as shown in FIG. 13, the length PT5L of the parallel extending portion of the portion PT5 formed at a position relatively close to the bonding pads 14 is made longer than the length PT3L of the portion PT3. For this reason, in the present Modification Example, the impedance of the portion PT5 is greater than the impedance of the portion PT3 as shown in FIG. 16.

In this manner, by allowing the impedance to become gradually greater toward the bonding pads 14, the change in the apparent impedance can be made further moderate.

Moreover, the configuration of the semiconductor device PKG3 of the Modification Example shown in FIG. 13 is the same as that of the semiconductor device PKG2 shown in FIG. 10, except for the above-mentioned difference. Therefore, the overlapped explanations will be omitted.

Modification Example 3

Figure 17:
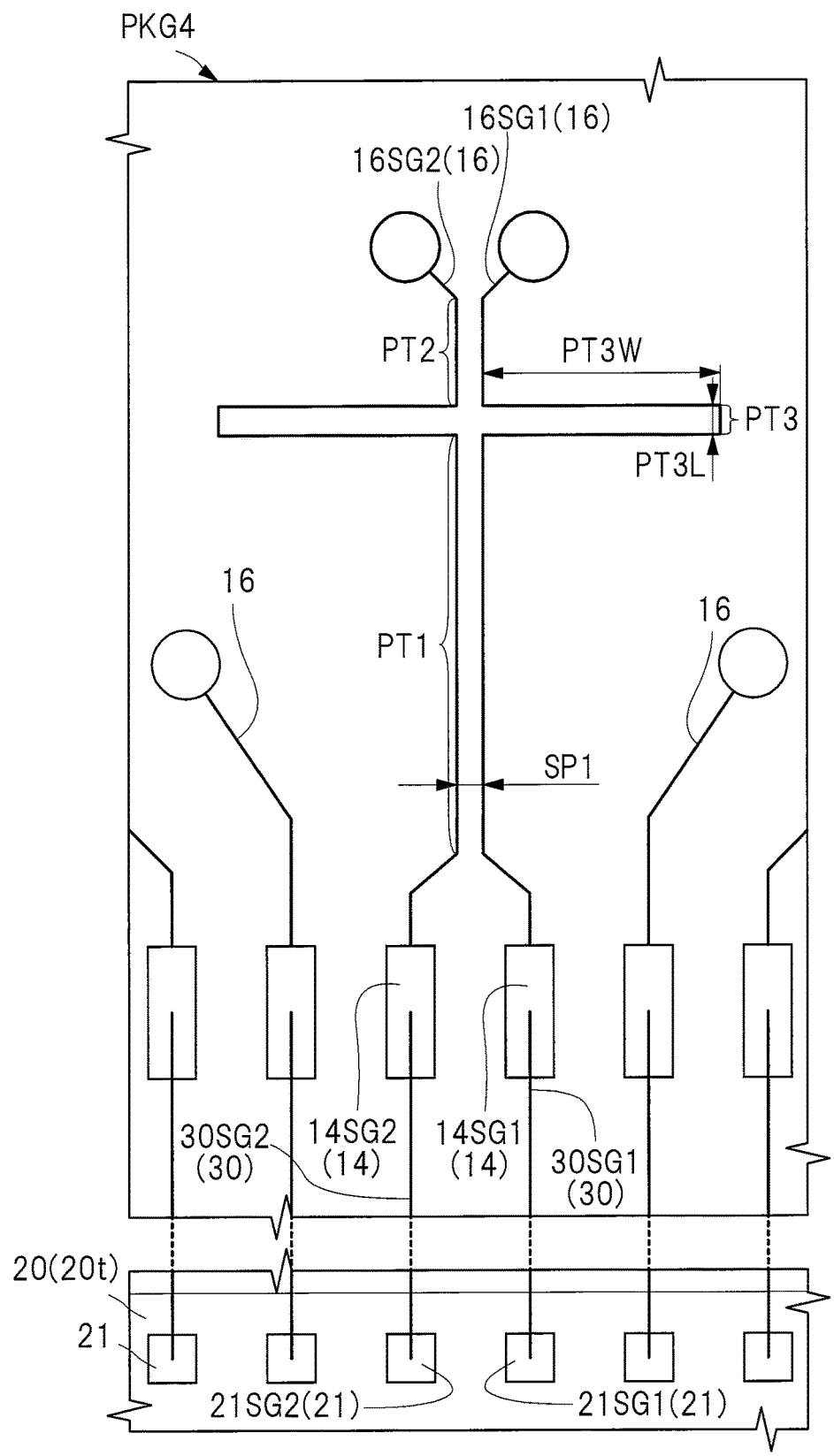
FIG. 17 is an enlarged plan view showing a periphery of a signal transmission path of a semiconductor device, which is an another Modification Example relative to FIG. 5.

Moreover, in the above-mentioned FIG. 5, FIG. 10 and FIG. 13, the explanation has been given by exemplifying a configuration in which the shape of the portion PT3 forming the impedance discontinuous point formed in the wiring 16SG1 and the wiring 16SG2 for use in transmitting a differential signal is formed into a meander shape that detours in directions mutually separating from each other in the portion PT3. However, with respect to the shape of the portion PT3, various Modification Examples are proposed. FIG. 17 is an enlarged plan view showing the periphery of the signal transmission path of a semiconductor device forming a Modification Example relative to FIG. 5. Moreover, FIG. 18 is an enlarged plan view showing one portion in an enlarged manner of the transmission path for a differential signal of a semiconductor device forming another Modification Example relative to FIG. 8.

Figure 18:
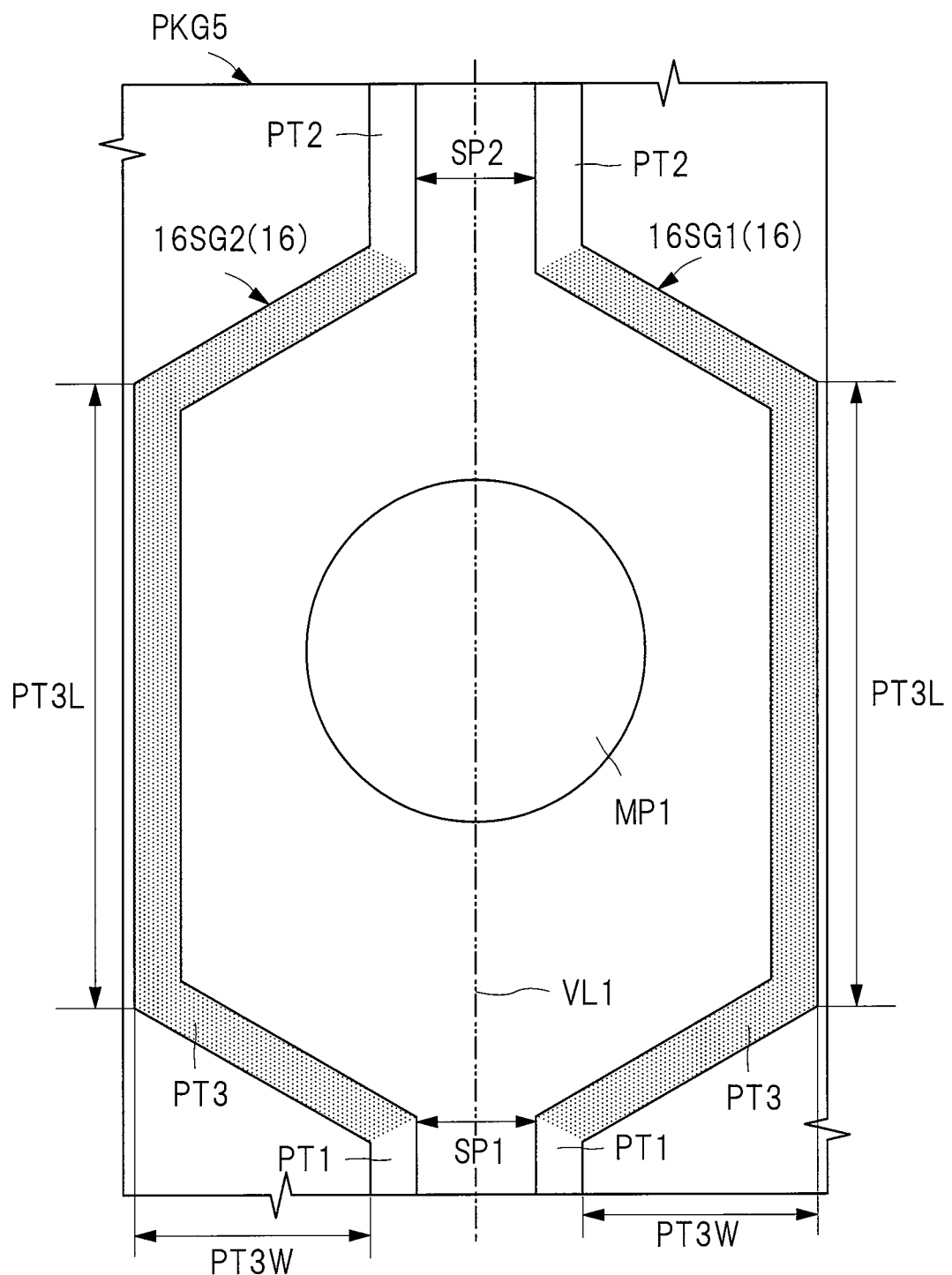
FIG. 18 is an enlarged plan view showing one portion of a transmission path of the differential signal in a semiconductor device, which is an another Modification Example relative to FIG. 8.

The semiconductor device PKG4 shown in FIG. 17 and the semiconductor device PKG5 shown in FIG. 18 are respectively different from the semiconductor device PKG1 shown in FIG. 5 in the shape of the portion PT3. More specifically, although the wiring 16SG1 and the wiring 16SG2 of the semiconductor device PKG4 and the semiconductor device PKG5 extend in directions separating from each other in the portion PT3, they do not meander. In other words, in the example shown in FIG. 17 and FIG. 18, the portion PT3 has an intersecting portion that extends in a direction intersecting with the extending direction of the portion PT1 and a pivoting portion that extends in a direction intersecting with the intersecting portion. Additionally, the pivoting portion is different from the parallel extending portion of the portion PT3 of the semiconductor device PKG1 shown in FIG. 5 in that it does not extend in parallel with the portion PT1 or the portion PT2.

Moreover, the portion PT3 which the semiconductor device PKG4 shown in FIG. 17 has is designed such that the length PT3W of the intersecting portion is longer than the length PT3L of the pivoting portion. In the case of the wiring configuration shown in FIG. 17, since the portion PT3 extends widely in a direction intersecting with the extending direction of the wiring 16SG1 and the wiring 16SG2, it is possible to make the inductive impedance value of the portion PT3 greater. However, from the viewpoint of improving the wiring density, it is more preferable to form the wiring configuration of the semiconductor device PKG1 shown in FIG. 5 in comparison with the wiring configuration shown in FIG. 17.

Additionally, in the example shown in FIG. 17, since the distance between the adjacent wirings 16 is sufficiently wide, no reference potential-use wiring is formed next to the wiring 16SG1 and the wiring 16SG2 for transmitting the differential signal. However, as a Modification Example relative to FIG. 17, reference potential-use wirings may be respectively formed on the both next sides of the wiring 16SG1 and the wiring 16SG2 for transmitting the differential signal.

On the other hand, in each of the portions PT3 which the semiconductor device PKG5 has shown in FIG. 18, the length PT3W of the intersecting portion is shorter than the length PT3L of the pivoting portion. Moreover, between the portions PT3 which the semiconductor device PKG5 has, a conductor pattern MP1 separated from the respective wiring 16SG1 and wiring 16SG2 is formed. In the case of the wiring configuration shown in FIG. 18, since the detouring distance of the portion PT3 is not large, the inductive impedance value is smaller than that in the case of the semiconductor device PKG1 shown in FIG. 8.

However, in the wiring configuration shown in FIG. 18, since the conductor pattern (via land, dummy pattern) MP1 is formed between the portions PT3, a capacitive impedance is added to the signal transmission path. The conductor pattern MP1 may be a floating metal pattern electrically separated from the other wirings 16. Moreover, in the case when the conductor pattern MP1 is electrically connected with the reference potential-use wiring, since the potential of the conductor pattern MP1 is stabilized, this configuration is preferable from the viewpoint of easily controlling the value of the capacitive impedance.

The configurations of the semiconductor device PKG4 of the Modification Example shown in FIG. 17 and the semiconductor device PKG5 shown in FIG. 18 are the same as that of the semiconductor device PKG1 shown in FIG. 5 and FIG. 8 except for the above-mentioned difference. Therefore, the overlapped explanations thereof will be omitted.

Modification Example 4

Figure 19:
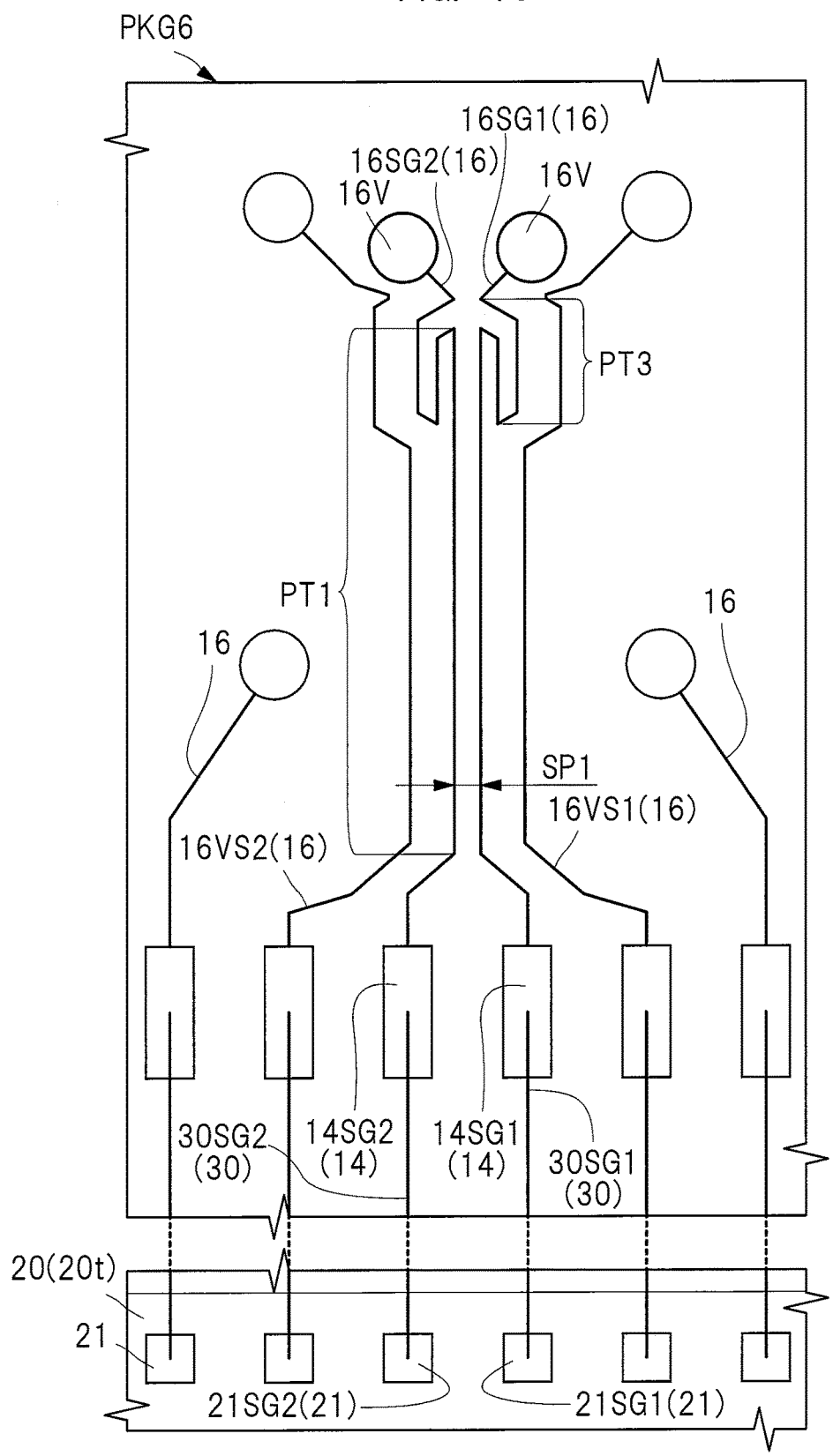
FIG. 19 is an enlarged plan view showing a periphery of a signal transmission path of a semiconductor device, which is an another Modification Example relative to FIG. 5.

Moreover, in the above-mentioned FIG. 5, FIG. 10, FIG. 13, FIG. 17 and FIG. 18, the explanations have been given by exemplifying a configuration in which the portion PT3 forming the impedance discontinuous point is formed between the parallel extending portions. However, with respect to the position at which the portion PT3 is formed, various Modification Examples are proposed. For example, as described in the above-mentioned embodiment and the Modification Example 1, the portion PT3 may be formed on a position other than the uppermost wiring layer. Moreover, for example, as in the case of the portion PT3 of the wiring 16SG1 and the wiring 16SG2 which the semiconductor device PKG6 has shown in FIG. 19, the portion PT3 may be formed in the vicinity of the via wiring 16V for use in electrically connecting different wiring layers with each other. FIG. 19 is an enlarged plan view showing the periphery of a signal transmission path of a semiconductor device relating to another Modification Example relative to FIG. 5.

The semiconductor device PKG6 shown in FIG. 19 is provided with the portion PT3 formed in the vicinity of the via wiring 16V so that it differs from the semiconductor device PKG1 shown in FIG. 5 in that no portion (parallel extending portion) PT2 shown in FIG. 5 is formed. However, the shape of the portion PT3 shown in FIG. 19 is the same as the shape of the portion PT3 shown in FIG. 5 and FIG. 8. Therefore, in the embodiment shown in FIG. 19 also, it becomes possible to increase the inductive impedance in the transmission path for the differential signal in the portion PT3.

Moreover, in the example shown in FIG. 19, the portion PT3 is formed at a position closer to the via wiring 16V in comparison with the bonding pads 14. In the vicinity of the bonding pads 14, wirings tend to be more densely present than in the vicinity of the via wiring 16V. Therefore, the present Modification Example is more preferable in that by forming the portion PT3 in the region having a relatively low wiring density, the impedance value of the portion PT3 can be easily adjusted.

The configuration of the semiconductor device PKG6 of the Modification Example shown in FIG. 19 is the same as that of the semiconductor device PKG1 shown in FIG. 5, except for the above-mentioned difference. Therefore, the overlapped explanations will be omitted.

Modification Example 5

Figure 20:
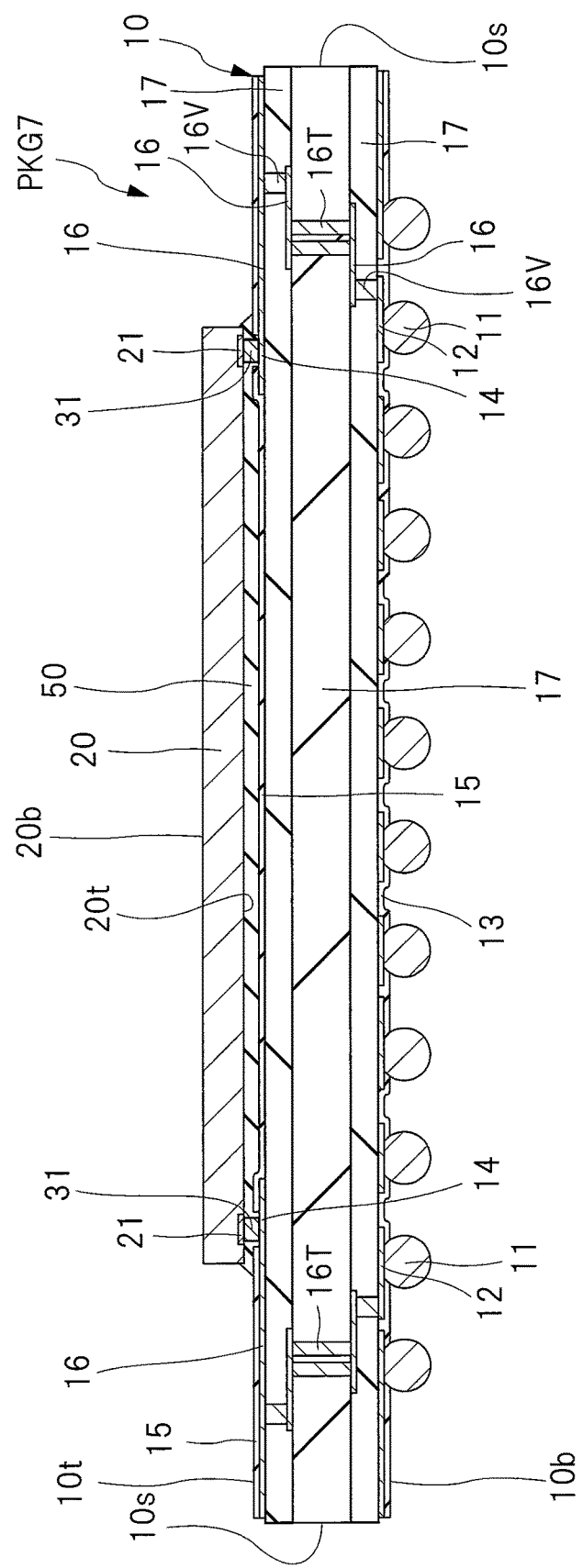
FIG. 20 is a cross-sectional view of a semiconductor device, which is a Modification Example relative to FIG. 4.
Figure 21:
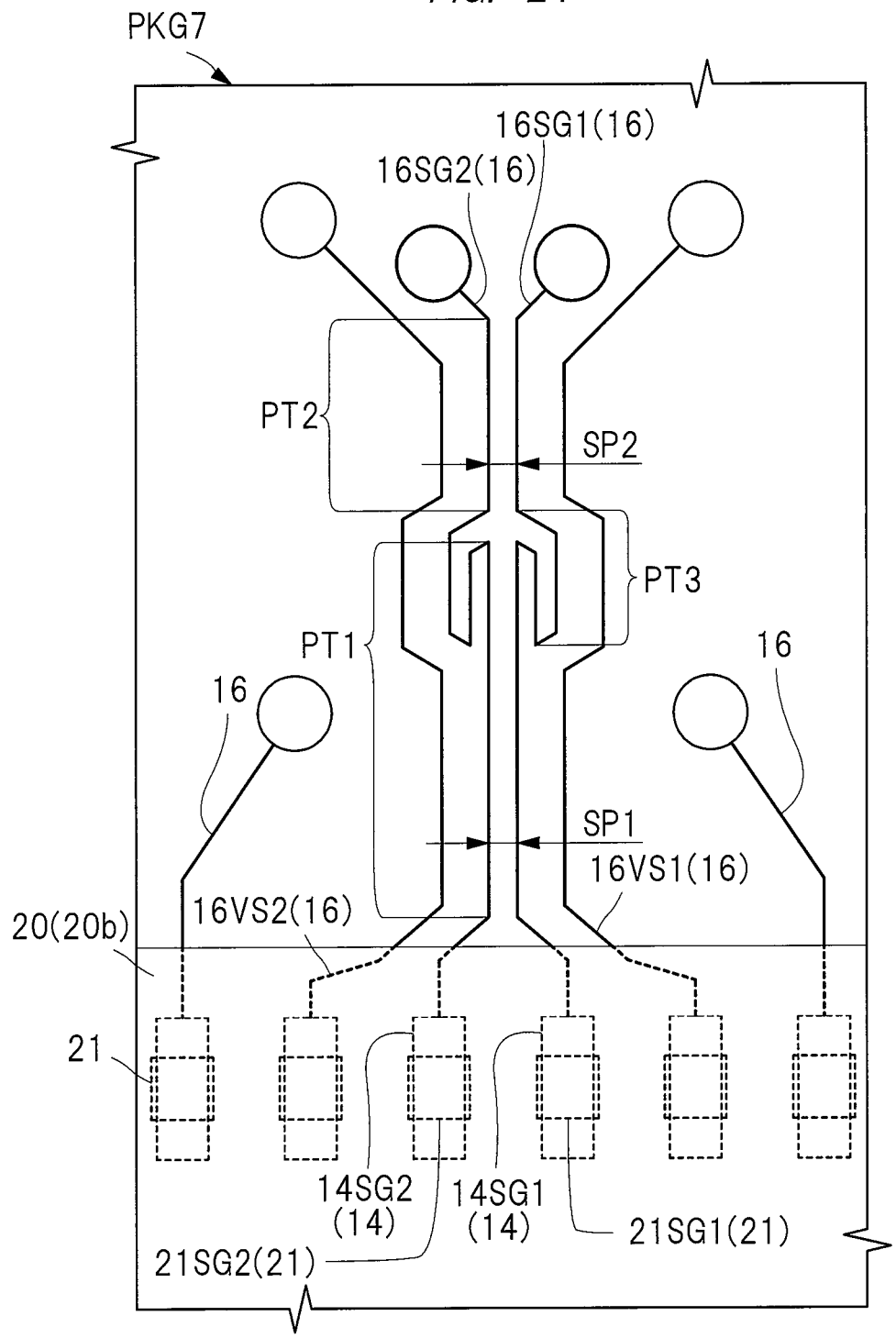
FIG. 21 is an enlarged plan view showing a periphery of a signal transmission path of the semiconductor device shown in FIG. 20.
Figure 22:
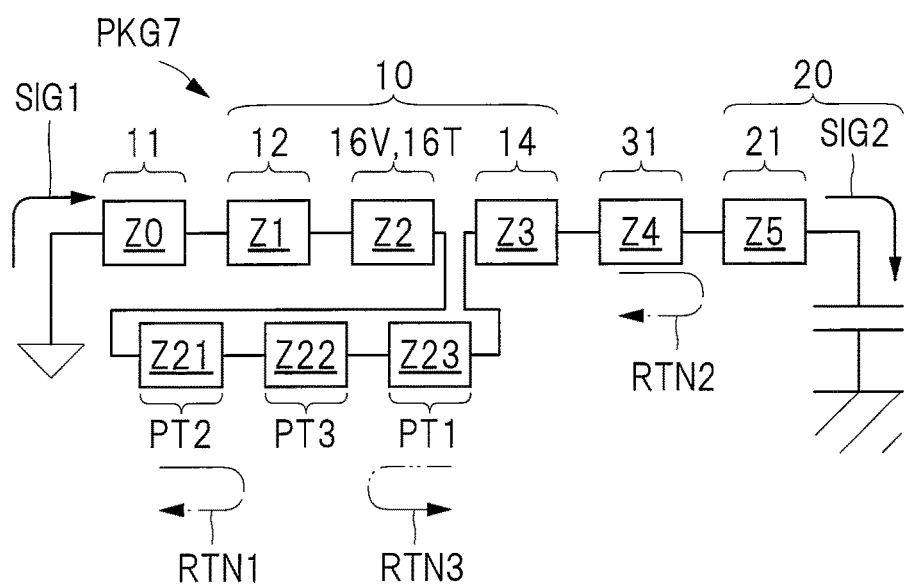
FIG. 22 is a circuit diagram showing a signal transmission path shown in FIG. 21.
Figure 23:
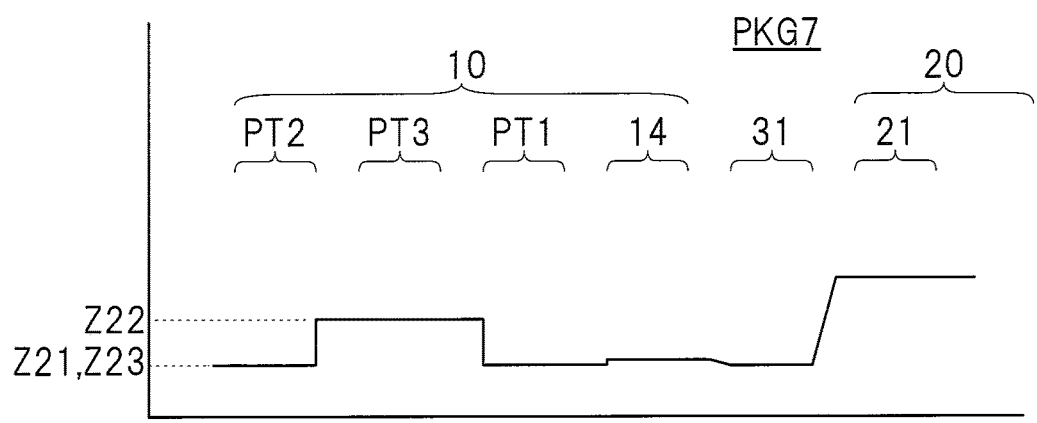
FIG. 23 is an explanatory diagram showing an example of impedance values of respective members shown in FIG. 22.

In the above-mentioned embodiments and various Modification Examples, the explanation has been given to the mode in which the semiconductor chip 20 and the wiring substrate 10 are electrically connected with each other via wires 30. However, as a Modification Example, the present invention may be applied to a mode in which the semiconductor chip 20 and the wiring substrate 10 are electrically connected with each other via a conductive member other than the wires 30. FIG. 20 is a cross-sectional view showing a semiconductor device serving as a Modification Example relative to FIG. 4. Moreover, FIG. 21 is an enlarged plan view showing the periphery of a signal transmission path of the semiconductor device shown in FIG. 20. FIG. 22 is a circuit diagram of the signal transmission path shown in FIG. 21. Furthermore, FIG. 23 is an explanatory diagram showing examples of the impedance values of the respective members shown in FIG. 22.

A semiconductor device PKG7 shown in FIG. 20 to FIG. 23 differs from the semiconductor device PKG1 shown in FIG. 1 to FIG. 8 in the connection method of the wiring substrate 10 and the semiconductor chip 20. More specifically, as shown in FIG. 20, in the semiconductor device PKG7, the semiconductor chip 20 is mounted on the wiring substrate 10 by a so-called face-down packaging method, with the surface 20t and the upper surface 10t of the wiring substrate 10 being opposed to each other.

Moreover, a plurality of pads 21 of the semiconductor chip 20 and a plurality of bonding pads of the wiring substrate 10 are electrically connected with each other, with a plurality of bump electrodes (conductive members, protruding electrodes, pillar-shaped electrodes) 31 being interposed therebetween. The bump electrodes 31 are conductive members for electrically connecting the pads 21 with the bonding pads 14 that are disposed so as to be opposed to each other, and, for example, have a structure in which a solder material is joined to each of the tips of protruding members formed by a metal material such as copper (Cu), gold (Au) or the like. Alternatively, the bump electrodes 31 may be formed by ball-shaped solder.

These bump electrodes 31 have a shorter extending distance in comparison with the wires 30 shown in FIG. 4. For this reason, in the portion of the bump electrode 31, its impedance is small as shown in FIG. 23. That is, a large impedance discontinuous point like that in the portion of the wires 30 shown in FIG. 7 is not formed. However, since the circuit provided in the semiconductor chip 20 is formed into a further minute circuit pattern, an impedance discontinuous point is formed at the border of the semiconductor chip 20 and the bump electrodes 31. As a result, as shown in FIG. 22, a signal reflection occurs at the border of the semiconductor chip 20 and the bump electrodes 31, with the result that a reflection signal RTN2 proceeds toward the solder balls 11.

Therefore, as shown in FIG. 21, in the semiconductor device PKG7, a portion PT3 having a greater mutual clearance is formed in the middle of the wirings 16SG1 and 16SG2 forming a differential pair. In the present Modification Example, a difference in impedances at the connection portion between the bonding pads 14 and the bump electrodes 31 is not so large as a difference in impedances at the connection portion between the bonding pads 14 and the wires 30, for example, shown in FIG. 7. However, according to the present Modification Example, even if the reflection signal RTN2 is generated, the reflection signal RTN2 can be re-reflected because of the installation of the portion PT3. Moreover, by installing the portion PT3 on the uppermost layer, the reflection signal RTN2 can be confined to the vicinity of the portion where the reflection occurred. Moreover, in the present Modification Example, the reflection amount of the reflection signal RTN2 generated at the border between the semiconductor chip 20 and the bump electrodes 31 is smaller than the reflection amount of the reflection signal RTN2 generated at the border between the wires 30 and the bonding pads 14 explained, for example, with reference to FIG. 6. Therefore, the impedance value of the portion PT3 which the semiconductor device PKG7 has may be smaller than the impedance value of the portion PT3 which the semiconductor device PKG1 shown in FIG. 5 has. In this case, it becomes possible to reduce the reflection amount of the reflection signal RTN1 generated at the border between the portion PT2 and the portion PT3 shown in FIG. 22.

Modification Example 6

As described above, for example, various Modification Examples have been explained, and the respective Modification Examples may be applied in combination with one another.

What is claimed is:
1. A semiconductor device comprising:
   a wiring substrate having:
      a first surface,
      a plurality of internal terminals formed on the first surface,
      a second surface opposite to the first surface,
      a plurality of external terminals formed on the second surface, and respectively electrically connected with the plurality of internal terminals, and
      a plurality of wirings respectively electrically connecting the plurality of internal terminals with the plurality of external terminals,
   a semiconductor chip having a plurality of pads, and mounted over the first surface of the wiring substrate; and
   a plurality of conductive members respectively electrically connecting the plurality of pads with the plurality of internal terminals,
   wherein the plurality of pads include a first pad and a second pad located next to the first pad,
   wherein the plurality of internal terminals include a first internal terminal electrically connected with the first pad via a first conductive member of the plurality of conductive members, and a second internal terminal electrically connected with the second pad via a second conductive member of the plurality of conductive members,
   wherein the second internal terminal is located next to the first internal terminal,
   wherein the plurality of wirings include a first wiring connected to the first internal terminal, and a second wiring connected to the second internal terminal,
   wherein the first wiring and the second wiring constitute a differential pair for transmitting a differential signal,
   wherein each of the first wiring and the second wiring has a first portion, a second portion formed on the same wiring layer as the first portion, and a third portion formed between the first portion and the second portion, wherein, in plan view, the first portion of the first wiring and the first portion of the second wiring are extended in parallel with each other with a first clearance, wherein, in plan view, the second portion of the first wiring and the second portion of the second wiring are extended in parallel with each other with a second clearance, and wherein, in plan view, the third portion of the first wiring and the third portion of the second wiring are extended such that the third portion of the first wiring and the third portion of the second wiring are detoured in a direction to be made a clearance greater than the first clearance and the second clearance.

2. The semiconductor device according to claim 1, wherein, through the first wiring and the second wiring, signal currents respectively having opposite polarities are allowed to flow.

3. The semiconductor device according to claim 1, wherein the shapes of the first wiring and the second wiring forming the differential pair have line symmetrical shapes relative to a first virtual line in the center of the first wiring and the second wiring.

4. The semiconductor device according to claim 1, wherein the first portion, the second portion and the third portion are formed on the same wiring layer as the plurality of internal terminals.

5. The semiconductor device according to claim 1, wherein the first wiring and the second wiring respectively meander in directions so as to be separated from each other in the third portion.

6. The semiconductor device according to claim 1, wherein the third portion which each of the first wiring and the second wiring has is further provided with an intersecting portion that is extended in a direction intersecting with the first portion and a parallel extending portion that is extended in parallel with the first portion or the second portion.

7. The semiconductor device according to claim 1, wherein the third portion has an impedance that is smaller than that of the semiconductor chip.

8. The semiconductor device according to claim 1, wherein the first clearance and the second clearance are equal to each other.

9. The semiconductor device according to claim 1, wherein the plurality of wirings include: a first reference potential wiring that is provided next to the first wiring along the first wiring, and supplies a reference potential to the semiconductor chip; and a second reference potential wiring that is provided next to the second wiring along the second wiring and supplies a reference potential to the semiconductor chip, and wherein the first wiring and the second wiring are disposed between the first reference potential wiring and the second reference potential wiring.

10. The semiconductor device according to claim 1, wherein the plurality of conductive members are wires.

11. The semiconductor device according to claim 10, wherein an impedance of the third portion is smaller than an impedance of the wire.

12. The semiconductor device according to claim 1, wherein the first wiring and the second wiring respectively have fourth portions that are provided between the first portion and the second portion and extended in parallel with each other with a third clearance, and fifth portions that are provided between the fourth portion and the first portion, and formed so as to detour in such directions as to allow the mutual clearance to become greater than the first clearance, the second clearance and the third clearance.

13. The semiconductor device according to claim 12, wherein the first portion, the second portion, the third portion, the fourth portion and the fifth portion are formed on the same wiring layer as the plurality of internal terminals.

14. The semiconductor device according to claim 13, wherein the third portion and the fifth portion included in the first wiring and the second wiring, respectively, are further provided with an intersecting portion that is extended in a direction intersecting with the first portion and a parallel extending portion that is extended in parallel with the first portion, the second portion, or the fourth portion.

15. The semiconductor device according to claim 14, wherein the fifth portion is formed at a position closer to the first internal terminal or the second internal terminal in comparison with the third portion, and wherein the length of the parallel extending portion of the fifth portion is longer than the length of the parallel extending portion of the third portion.

16. The semiconductor device according to claim 9, wherein between the third portions which the first wiring and the second wiring have, respectively, a first conductor pattern that is separated from the first wiring and the second wiring is formed.

17. A semiconductor device comprising:
a wiring substrate having:
  a first surface,
  a plurality of internal terminals formed on the first surface,
  a second surface opposite to the first surface,
  a plurality of external terminals formed on the second surface, and respectively electrically connected with the plurality of internal terminals, and
  a plurality of wirings respectively electrically connecting the plurality of internal terminals with the plurality of external terminals,
a semiconductor chip having a plurality of pads, and mounted over the first surface of the wiring substrate; and
a plurality of conductive members respectively electrically connecting the plurality of pads with the plurality of internal terminals,
wherein the plurality of pads include a first pad and a second pad located next to the first pad,
wherein the plurality of internal terminals include a first internal terminal electrically connected with the first pad via a first conductive member of the plurality of conductive members, and a second internal terminal electrically connected with the second pad via a second conductive member of the plurality of conductive members,
wherein the plurality of wirings constitute a differential pair for transmitting a differential signal,
wherein the plurality of wirings include a first wiring connected to the first internal terminal, and a second wiring connected to the second internal terminal,
wherein each of the first wiring and the second wiring has a first portion, and a second portion formed on the same wiring layer as the first portion,
wherein, in plan view, the first portion of the first wiring and the first portion of the second wiring are extended in parallel with each other with a first clearance, wherein, in plan view, the second portion of the first wiring and the second portion of the second wiring are extended such that the second portion of the first wiring and the second portion of the second wiring are detoured in a direction to be made a clearance greater than the first clearance, and wherein the first wiring and the second wiring respectively meander in directions so as to be separated from each other in the second portion.

\* \* \* \* \*